(12) United States Patent
Lee

(10) Patent No.: US 12,322,598 B2
(45) Date of Patent: Jun. 3, 2025

(54) METHOD OF PROCESSING SUBSTRATE

(71) Applicant: Samsung Electronics Co., Ltd., Suwon-si (KR)

(72) Inventor: Hwayoung Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 403 days.

(21) Appl. No.: 17/838,304

(22) Filed: Jun. 13, 2022

(65) Prior Publication Data

US 2023/0129020 A1 Apr. 27, 2023

(30) Foreign Application Priority Data

Oct. 27, 2021 (KR) .......................... 10-2021-0144972

(51) Int. Cl.
| | |
|---|---|
| *H01L 21/268* | (2006.01) |
| *B23K 26/03* | (2006.01) |
| *B23K 26/53* | (2014.01) |
| *B23K 103/00* | (2006.01) |
| *H01L 21/683* | (2006.01) |
| *H01L 21/78* | (2006.01) |

(52) U.S. Cl.
CPC .......... *H01L 21/268* (2013.01); *B23K 26/032* (2013.01); *B23K 26/53* (2015.10); *H01L 21/6838* (2013.01); *H01L 21/78* (2013.01); *B23K 2103/56* (2018.08)

(58) Field of Classification Search
CPC ... H01L 21/268; H01L 21/6838; H01L 21/78; B23K 26/032; B23K 26/53; B23K 2103/56
See application file for complete search history.

(56) References Cited

U.S. PATENT DOCUMENTS

| | | | |
|---|---|---|---|
| 7,265,028 B2 | 9/2007 | Xie | |
| 7,521,337 B2 | 4/2009 | Sekiya et al. | |
| 8,524,572 B2 | 9/2013 | Qin et al. | |
| 2005/0194364 A1* | 9/2005 | Fukuyo | B23K 26/066 219/121.67 |
| 2006/0108339 A1* | 5/2006 | Nishiwaki | B23K 26/53 219/121.72 |
| 2018/0076060 A1* | 3/2018 | Oh | H01L 21/68757 |
| 2020/0398381 A1* | 12/2020 | Richter | B23K 26/04 |

FOREIGN PATENT DOCUMENTS

| | | | | |
|---|---|---|---|---|
| JP | 2010-232603 A | * | 10/2010 | ......... H01L 21/6838 |
| JP | 6046535 B2 | | 12/2016 | |
| JP | 6290010 B2 | | 3/2018 | |
| JP | 6735372 B2 | | 8/2020 | |
| JP | 2020163447 A | | 10/2020 | |
| KR | 100667460 B1 | | 1/2007 | |
| KR | 100853055 B1 | | 8/2008 | |
| KR | 100934300 B1 | | 12/2009 | |

\* cited by examiner

*Primary Examiner* — Peter Bradford
*Assistant Examiner* — Ryan T. Fortin
(74) *Attorney, Agent, or Firm* — Muir Patent Law, PLLC

(57) ABSTRACT

A method of processing a substrate includes mounting a substrate on a concave mounting surface of a mounting table and deforming a surface of the substrate into a concave shape; detecting, by a height sensor, a height of the surface of the substrate in a vertical direction; determining positions of a plurality of first focus points based on height data of the surface of the substrate, detected by the height sensor; and forming a first modification layer in the substrate by irradiating the plurality of first focus points with a laser beam.

19 Claims, 16 Drawing Sheets

FIG. 2
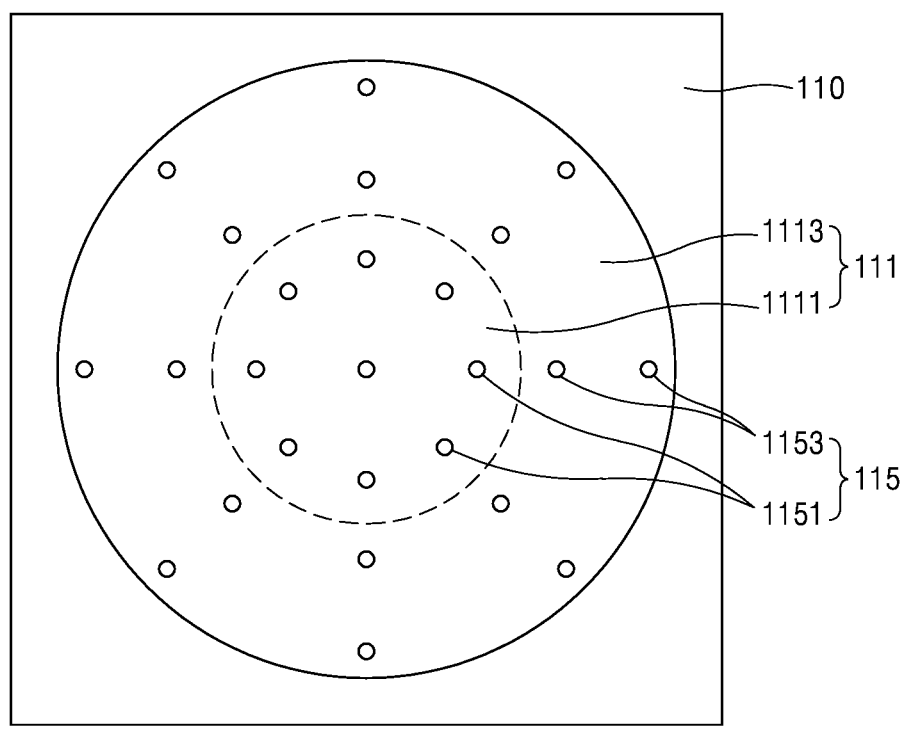
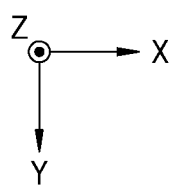

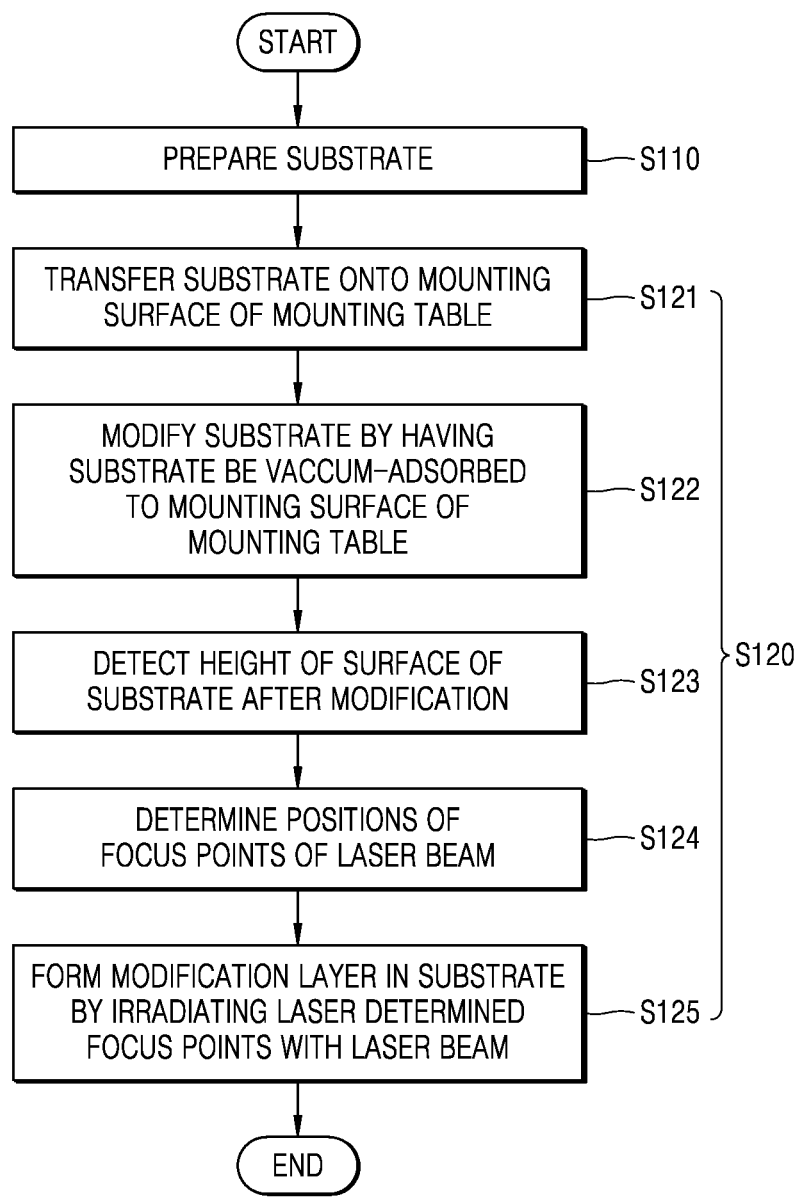

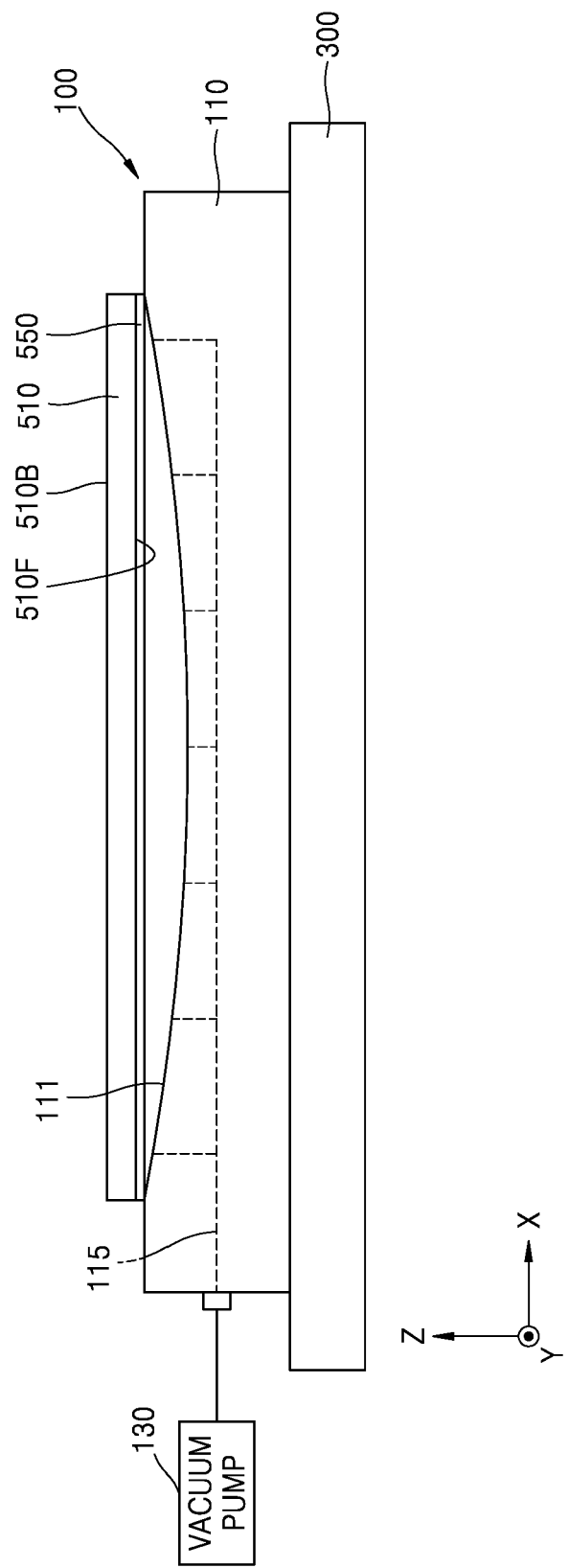

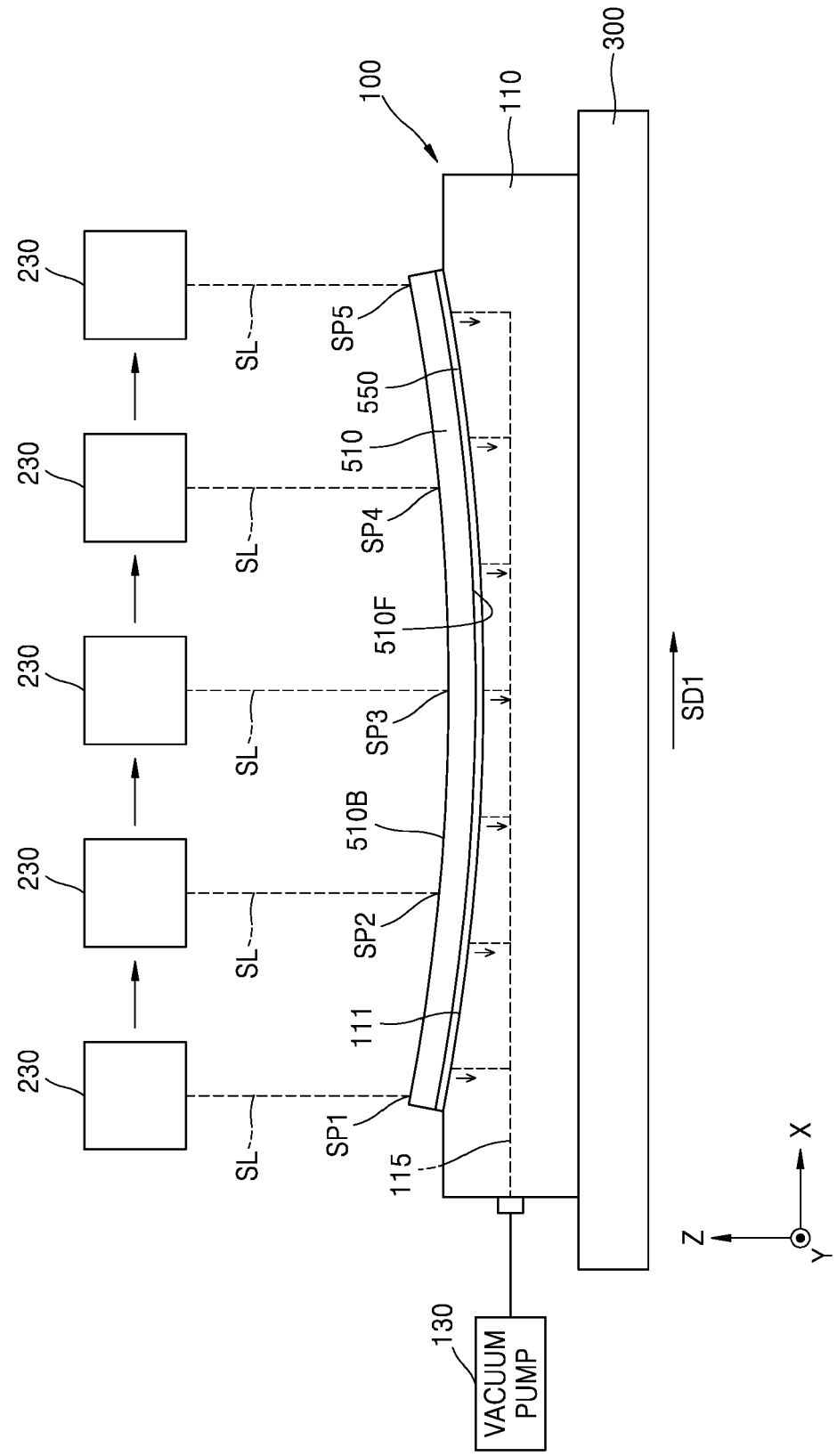

METHOD OF PROCESSING SUBSTRATE

CROSS-REFERENCE TO RELATED APPLICATION

This application is based on and claims priority under 35 U.S.C. § 119 to Korean Patent Application No. 10-2021-0144972, filed on Oct. 27, 2021, in the Korean Intellectual Property Office, the disclosure of which is incorporated by reference herein in its entirety.

BACKGROUND

The inventive concept relates to a method of processing a substrate, and more particularly, to a method of processing a substrate to cut the substrate by using a laser beam.

Integrated circuits are formed on an active surface of a semiconductor substrate, the semiconductor substrate is cut, and then the integrated circuits are separated into individual semiconductor chips. Generally, a semiconductor substrate is mechanically cut by using a sawing blade. When a semiconductor substrate is mechanically cut as stated above, there is high possibility of defects such as chipping in semiconductor chips. Recently, a method of cutting a substrate by using a laser beam is used as a method of reducing physical damage such as chipping of a semiconductor chip.

SUMMARY

The inventive concept provides a method of processing a substrate, the method being configured to cut a substrate by using a laser beam.

Technical goals of the inventive concept are not limited to the statement above, and goals unmentioned herein may be clearly understood by those skilled in the art based on the following descriptions.

According to an aspect of the inventive concept, there is provided a method of processing a substrate, the method including: mounting a substrate on a concave mounting surface of a mounting table and deforming a surface of the substrate into a concave shape; detecting, by a height sensor, a height of the surface of the substrate in a vertical direction; determining positions of a plurality of first focus points based on height data of the surface of the substrate, detected by the height sensor; and forming a first modification layer in the substrate by irradiating the plurality of first focus points with a laser beam.

According to an aspect of the inventive concept, there is provided a method of processing a substrate, the method including: preparing a substrate, the substrate including a plurality of integrated circuit regions and a cutting region separating the integrated circuit regions from one another; and cutting the substrate along the cutting region, wherein the cutting of the substrate comprises mounting the substrate on a concave mounting surface of a mounting table and deforming a surface of the substrate into a concave shape; detecting, by a height sensor, a height of the surface of the substrate in a vertical direction; determining positions of a plurality of first focus points on the basis of height data of the surface of the substrate, detected by the height sensor; and forming a first modification layer in the substrate by irradiating the plurality of first focus points with a laser beam, and the plurality of first focus points are provided in the cutting region and are the same distance from the surface of the substrate.

According to an aspect of the inventive concept, there is provided a method of processing a substrate, the method including: preparing a substrate, the substrate including a plurality of integrated circuit regions and a cutting region separating the integrated circuit regions from one another; and cutting the substrate along the cutting region, wherein the cutting of the substrate comprises transferring the substrate onto a mounting surface of a mounting table, the mounting surface including a concave surface; deforming a surface of the substrate into a concave shape by vacuum-adsorbing the substrate to the mounting surface of the mounting table; detecting, by using a height sensor, heights at a plurality of measurement points on the surface of the substrate while moving the mounting table in a first horizontal direction; determining positions of a plurality of first focus points, on the basis of height data of the surface of the substrate, detected by the height sensor; and forming a first modification layer in the substrate by irradiating the plurality of first focus points with a laser beam while moving the mounting table in a direction opposite to the first horizontal direction, wherein the plurality of first focus points are on a first focus line that is offset by a uniform distance from the surface of the substrate, the laser beam is an infrared ray, and a distance in a vertical direction between an edge of the mounting surface of the mounting table and a center of the mounting surface is from about 25 μm to about 800 μm.

BRIEF DESCRIPTION OF THE DRAWINGS

Embodiments of the inventive concept will be more clearly understood from the following detailed description taken in conjunction with the accompanying drawings in which:

FIG. 2 is a plan view of a mounting table of a chuck table shown in FIG. 1;

FIG. 5 is a flowchart of a method of processing a substrate, according to example embodiments of the inventive concept;

FIGS. 6A to 6E are diagrams of a method of processing a substrate, according to example embodiments of the inventive concept;

DETAILED DESCRIPTION OF THE EMBODIMENTS

Figure 1:
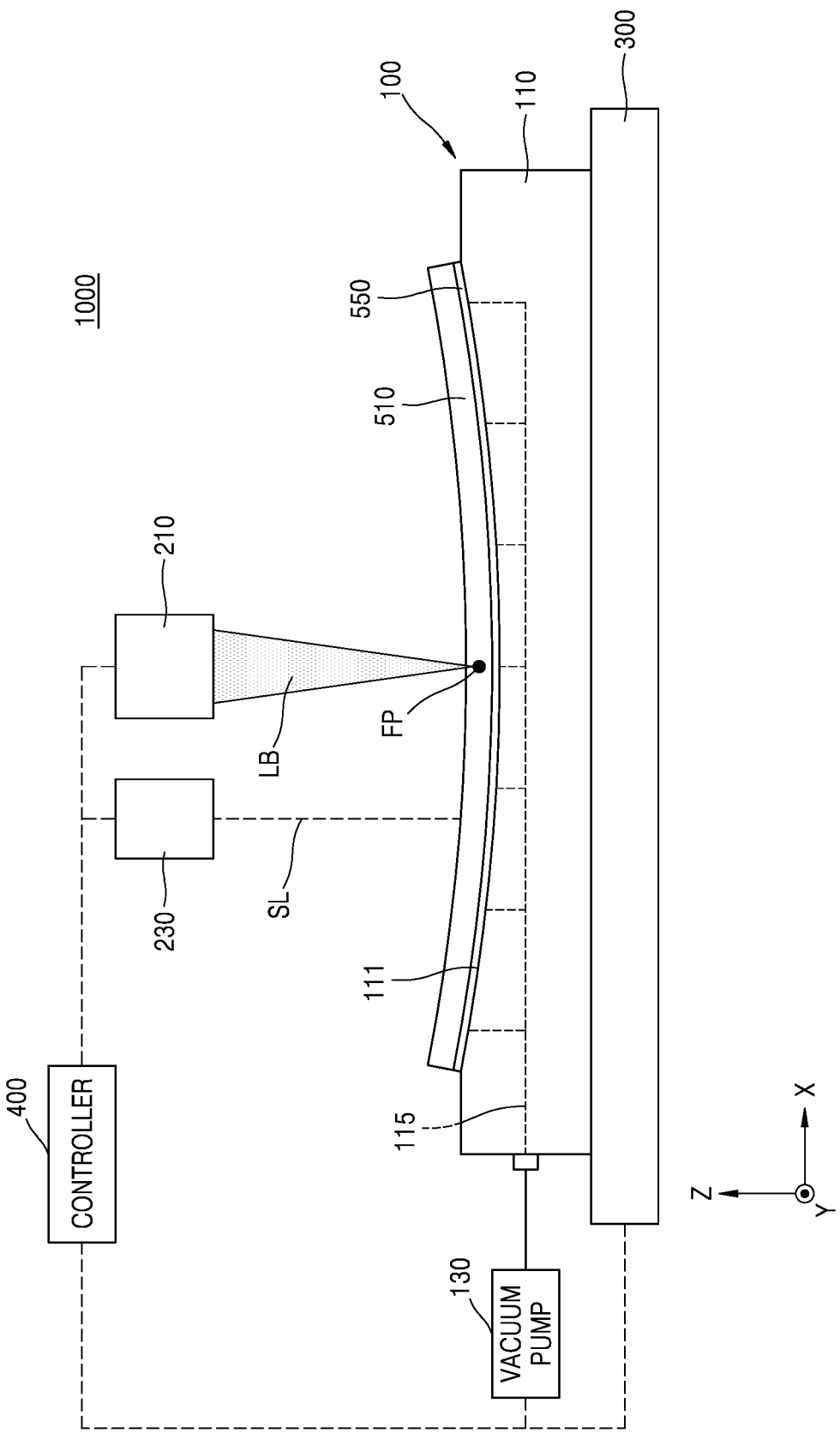
FIG. 1 is a diagram of a substrate processing apparatus according to example embodiments of the inventive concept.

Hereinafter, embodiments of the inventive concept will be described in detail with reference to the accompanying drawings. Same reference numerals denote same components in the drawings, and repeated descriptions thereof will be omitted.

Figure 3:
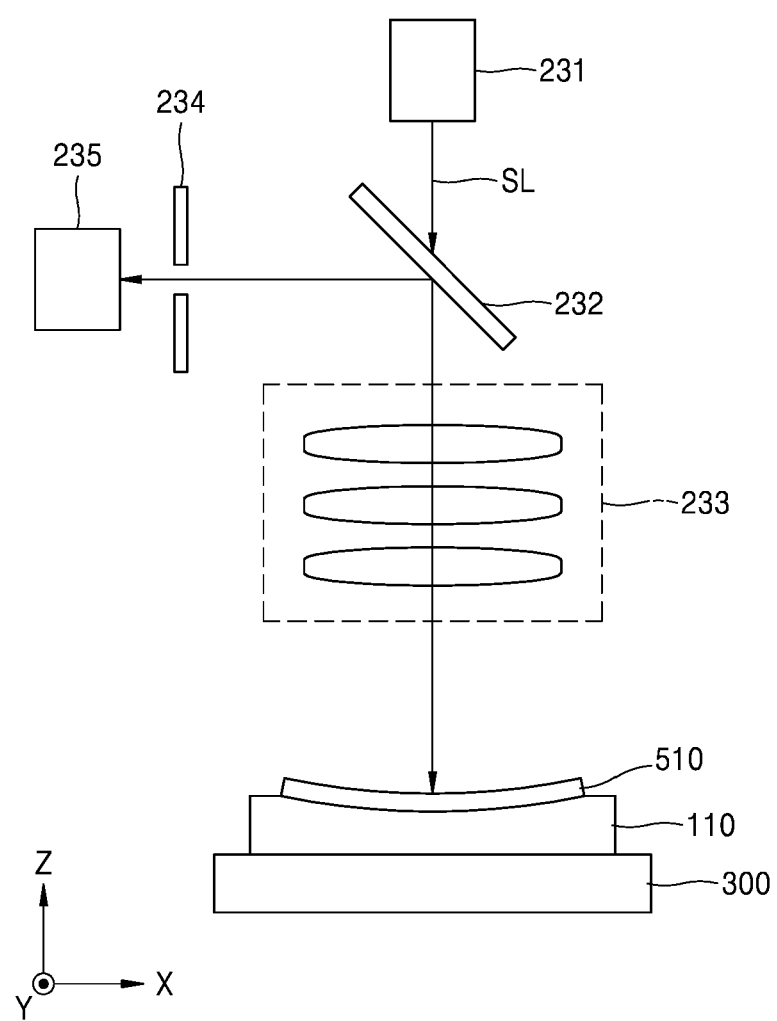
FIG. 3 is a diagram of a height sensor shown in FIG. 1.
Figure 4:
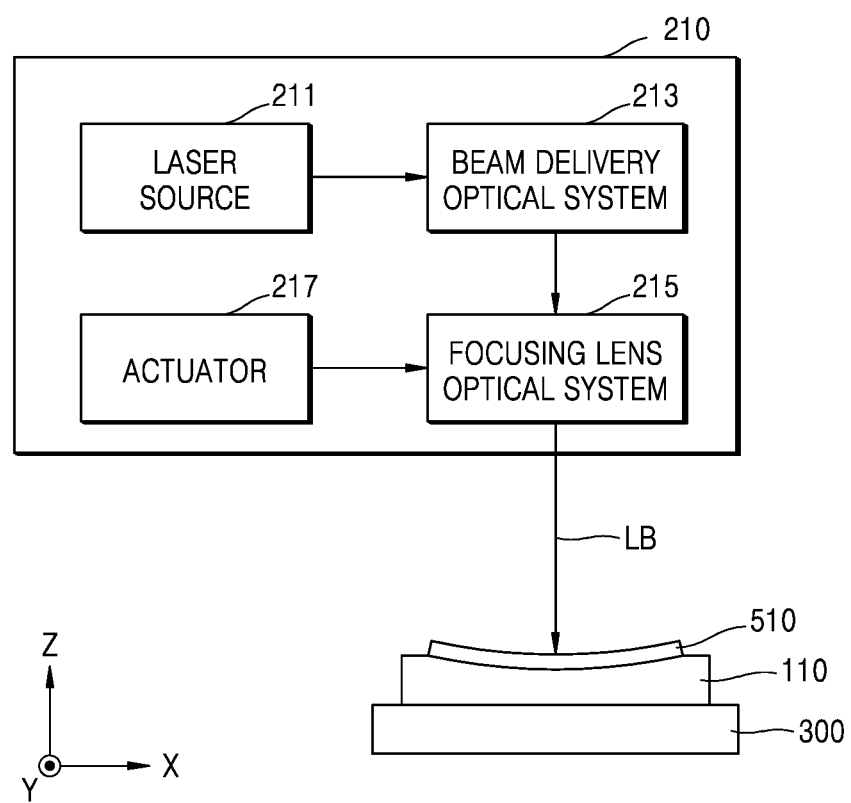
FIG. 4 is a diagram of a laser supply head shown in FIG. 1.

FIG. 1 is a block diagram of a substrate processing apparatus 1000 according to example embodiments of the inventive concept. FIG. 2 is a plan view of a mounting table 110 of a chuck table 100 shown in FIG. 1. FIG. 3 is a diagram of a height sensor 230 shown in FIG. 1. FIG. 4 is a diagram of a laser supply head 210 shown in FIG. 1.

Referring to FIGS. 1 to 4, the substrate processing apparatus 1000 may be configured to perform a dicing process of separating a substrate 510, which is a workpiece, into structures of single chip units. In example embodiments, the substrate processing apparatus 1000 may be configured to perform a laser dicing process to cut the substrate 510 by using a laser beam LB. In example embodiments, the substrate processing apparatus 1000 may be configured to perform a stealth dicing process to collect the laser beam LB in the substrate 510 to form a modification layer in the substrate 510 and cut the substrate 510 by using cracks induced from the modification layer.

The substrate processing apparatus 1000 may include the chuck table 100 configured to support the substrate 510, the laser supply head 210 configured to output the laser beam LB for processing the substrate 510, the height sensor 230 configured to detect a height of a surface of the substrate 510, a stage 300, and a controller 400.

The chuck table 100 may include a mounting table 110 including a mounting surface 111 above/on which the substrate 510 is mounted. The mounting surface 111 of the mounting table 110 may indicate a surface vertically overlapping with the substrate 510 or contacting the substrate 510 when the substrate 510 is mounted above/on the mounting table 110. The mounting surface 111 of the mounting table 110 has a shape corresponding to a shape of the substrate 510, and may have, in a plan view, a circle shape. The substrate 510 may be entirely attached to the mounting surface 111 of the mounting table 110. For example, a center and an outer portion of the substrate 510 may each be attached to the mounting surface 111 of the mounting table 110.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The chuck table 100 may have the substrate 510, which is above/on the mounting surface 111 of the mounting table 110, attached to the mounting surface 111 of the mounting table 110. The chuck table 100 may be configured to perform a chucking operation to apply an external force to the substrate 510 such that the substrate 510 is attached to the mounting table 110, or a de-chucking operation to release or terminate the external force to the substrate 510 such that the substrate 510 may be separated from the mounting table 110.

In example embodiments, the chuck table 100 may be configured to vacuum-adsorb the substrate 510. The mounting surface 111 of the mounting table 110 is a surface to which the substrate 510 is vacuum-adsorbed, and the mounting table 110 may include vacuum channels 115 extending from the mounting surface 111 into the mounting table 110. The vacuum channels 115 may be exposed through the mounting surface 111. The vacuum channels 115 may be uniformly distributed on the mounting surface 111.

In example embodiments, the mounting table 110 may include: first vacuum channels 1151 provided in a central portion 1111 of the mounting surface 111; and second vacuum channels 1153 provided at an outer portion 1113 of the mounting surface 111. The outer portion 1113 of the mounting surface 111 may surround the central portion 1111 of the mounting surface 111, e.g., in a plan view. One or at least two first vacuum channels 1151 may be provided in the central portion 1111 of the mounting surface 111, and one or at least two second vacuum channels 1153 may be provided in the outer portion 1113 of the mounting surface 111. The first vacuum channels 1151 may extend from the central portion 1111 of the mounting surface 111, and the second vacuum channels 1153 may extend from the outer portion 1113 of the mounting surface 111. In this case, the center of the substrate 510 is vacuum-adsorbed to the mounting table 110 due to an adsorption force applied through the first vacuum channels 1151 in the central portion 1111 of the mounting surface 111, and an outer portion of the substrate 510 may be vacuum-adsorbed to the mounting table 110 due to an adsorption force applied through the second vacuum channels 1153 in the outer portion 1113 of the mounting surface 111.

The chuck table 100 may include a vacuum pump 130 connected to the vacuum channels 115 of the mounting table 110. The vacuum pump 130 may have the substrate 510 be vacuum-adsorbed to the mounting surface 111 of the mounting table 110 by applying a vacuum pressure to the vacuum channels 115 of the mounting table 110. For example, when the vacuum pump 130 applies the vacuum pressure to the vacuum channels 115 of the mounting table 110, a pressure lower than a peripheral pressure is generated on a surface of the substrate 510 facing the mounting surface 111 of the mounting table 110, and thus, the substrate 510 may be vacuum-adsorbed to the mounting table 110. In addition, the vacuum pump 130 may release or terminate the vacuum pressure on the vacuum channels 115 of the mounting table 110, thereby allowing the substrate 510 to be separable from the mounting table 110.

In other example embodiments, the chuck table 100 may include an electrostatic chuck configured to fix/hold the substrate 510 by using an electrostatic force. Alternatively, the chuck table 100 may also be configured to fix/hold the substrate 510 in a mechanical manner.

The chuck table 100 may be configured to forcibly deform or modify the substrate 510 attached to the mounting surface 111 of the mounting table 110. For example, although the substrate 510 basically has a plane shape, the chuck table 100 may deform or modify the substrate 510 to be at least partially curved.

In example embodiments, the chuck table 100 may deform the substrate 510 such that the substrate 510 has a shape complementary with a shape of the mounting surface 111. In example embodiments, the chuck table 100 may deform the substrate 510 such that a top surface and a bottom surface of the substrate 510 each have a curved surface. For example, the chuck table 100 may deform the substrate 510 such that the whole area of the bottom surface of the substrate 510 contacts the mounting surface 111 of the mounting table 110. In example embodiments, the chuck table 100 may deform the substrate 510 such that the top surface of the substrate 510 is deformed into a concave shape, e.g., such that the center of the substrate 510 protrudes outward/downward with reference to an edge of the substrate 510. For example, the center of the substrate 510 may be at a lower position/level than edges of the substrate 510 when the substrate 510 is adsorbed to the mounting surface 111 of the mounting table 110. In other example embodiments, the chuck table 100 may deform the substrate 510 such that the top surface of the substrate has a convex shape, e.g., such that the center of the substrate 510 protrudes upward with reference to the edge of the substrate 510. For example, the center of the substrate 510 may be at a higher position/level than the edges of the substrate 510 when the substrate 510 is adsorbed on the mounting surface 111 of the mounting table 110.

Spatially relative terms, such as "beneath," "below," "lower," "above," "upper" and the like, may be used herein for ease of description to describe positional relationships. It will be understood that the spatially relative terms encompass different orientations of the device in addition to the orientation depicted in the figures.

In example embodiments, the mounting surface 111 of the mounting table 110 may include an uneven surface. From a cross-sectional view, the mounting surface 111 of the mounting table may have a curved portion. For example, from the cross-sectional view, the mounting surface 111 of the mounting table 110 may have a curvature. In this case, the chuck table 100 may apply an external force to the substrate 510 and deform the substrate 510 to have a curvature equal to the curvature of the mounting surface 111 of the mounting table 110. For example, when the substrate 510 transferred from the outside is mounted on the mounting surface 111 of the mounting table 110, the chuck table 100 may vacuum-adsorb the substrate 510 such that the substrate 510 is closely attached to the mounting surface 111 of the mounting table 110. As the substrate 510 is vacuum-adsorbed to the mounting surface 111 of the mounting table 110, the substrate 510 may be deformed into a shape corresponding to the shape of the mounting surface 111 of the mounting table 110.

The mounting surface 111 of the mounting table 110 may have a concave shape. From a cross-sectional view, the center of the mounting surface 111 of the mounting table 110 may be at a level lower than the edge of the mounting surface 111. Various dimensions of the mounting surface 111 (for example, a diameter of the mounting surface 111, a height difference in a vertical direction (the Z direction) between the center of the mounting surface 111 and the edge of the mounting surface 111, the curvature of the mounting surface 111, and the like) may be appropriately adjusted depending on a size of the substrate 510, a target modification amount of the substrate 510, and the like. For example, the height difference in the vertical direction (the Z direction) between the center of the mounting surface 111 and the edge of the mounting surface 111 may be from about tens of micrometers to about several millimeters. In example embodiments, the height difference in the vertical direction (the Z direction), e.g., a vertical level difference, between the center of the mounting surface 111 and the edge of the mounting surface 111 may be from about 25 μm to about 800 μm, from about 35 μm to about 600 μm, or from about 50 μm to about 400 μm. In example embodiments, a radius of the mounting surface 111 (that is, a distance in a horizontal direction (the X direction and/or Y direction) between the center of the mounting surface 111 and the edge of the mounting surface 111) may be similar to a radius of the substrate 510 mounted above/on the mounting surface 111. For example, the radius of the mounting surface 111 may be from about 15 mm to about 200 mm.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The chuck table 100 may vacuum-adsorb the substrate 510 such that the substrate 510 is tightly attached to the mounting surface 111 of the mounting table 110, thereby deforming the substrate 510 into a concave shape. The mounting surface 111 of the mounting table 110 may entirely have a concave shape, or only a portion of the mounting surface 111 may have a concave shape.

As shown in FIG. 1, the mounting surface 111 of the mounting table 110 may include a concave surface. From a cross-sectional view, the center of the mounting surface 111 of the mounting table 110 is at a level that is lower than the level of the edge of the mounting surface 111, and the mounting surface 111 of the mounting table 110 may have a profile extending in a curved shape. In this case, as the substrate 510 is vacuum-adsorbed to the mounting surface 111 of the mounting table 110, the top surface and/or the bottom surface of the substrate 510 may be deformed to have a curvature equal to the curvature of the mounting surface 111 of the mounting table 110.

In example embodiments, the mounting surface 111 of the mounting table 110 may have a concave curved surface as a whole. For example, from a cross-sectional view, the mounting surface 111 of the mounting table 110 may have a profile extending in the shape of a curve from an edge of the mounting surface 111 to another edge (e.g., an opposite edge) of the mounting surface 111.

In example embodiments, only a portion of the mounting surface 111 of the mounting table 110 may include a concave curved surface. For example, the central portion 1111 of the mounting surface 111 of the mounting table 110 may include a concave curved surface, and the outer portion surrounding the central portion 1111 of the mounting surface 111 of the mounting table 110 may include a planar surface. In this case, from a cross-sectional view, the central portion 1111 of the mounting surface 111 of the mounting table 110 may have a curved profile, and the outer portion 1113 of the mounting surface 111 of the mounting table 110 may have a straight profile.

In example embodiments, the mounting surface 111 of the mounting table 110 may have a uniform curvature. For example, a curvature of the central portion 1111 of the mounting surface 111 of the mounting table 110 may be identical to a curvature of the outer portion 1113 of the mounting surface 111 of the mounting surface 110.

In example embodiments, the mounting surface 111 of the mounting table 110 may have different curvatures depending on regions of the mounting surface 111. For example, the curvature of the central portion 1111 of the mounting surface 111 of the mounting table 110 may be different from the curvature of the outer portion 1113 of the mounting surface 111 of the mounting table 110. For example, the curvature of the central portion 1111 of the mounting surface 111 of the mounting table 110 may be greater than the curvature of the outer portion 1113 of the mounting surface 111 of the mounting table 110.

The height sensor 230 may detect a height (e.g., a position in the vertical direction (the Z direction)) of a surface of the substrate 510. For example, the height sensor 230 may be configured to detect a height of the entire region of the top surface of the substrate 510. For example, the height sensor 230 may be configured to detect heights of a plurality of measure positions of the top surface of the substrate 510 while the mounting table 110 moves or rotates in the horizontal direction (the X direction and/or Y direction). For example, a height of a measure position near an edge of the top surface of the substrate 510 may be determined to be a reference value (for example, zero), and heights of other measure positions of the top surface of the substrate 510 may be determined by differences from the reference value.

For example, the height sensor 230 may include a laser-type displacement sensor, an eddy current-type displacement sensor, a capacitance-type displacement sensor, and an ultrasonic-type displacement sensor.

In example embodiments, the height sensor 230 may include or may be a confocal sensor. In this case, as illustrated in FIG. 3, the height sensor 230 may include a light source 231, a lens optical system 233 including a plurality of lenses, a beam splitter 232, and a detector 235. For example, the light source 231 may output height-measuring light SL. The height-measuring light SL may include various components (for example, red light, green light, and the like) respectively having different wavelengths. For example, the height-measuring light SL may include or may be white light. The height measuring light SL output from the light source 231 may irradiate the substrate 510 via the beam splitter 232 and the lens optical system 233. The components of the height-measuring light SL are separated by wavelengths by the lens optical system 233, and focal lengths of the components of the height-measuring light SL vary depending on wavelengths. Reflected light of the height-measuring light SL reflected from the substrate 510 is transmitted to the detector 235 through the beam splitter 232 and a pin hole of a blocking film 234. The detector 235 may detect an intensity of incident light through the pin hole of the blocking film 234. The detector 235 may include a spectrometer, an image device such as a charge-coupled device (CCD), and/or a camera. Among the components of the height-measuring light SL, the detector 235 may measure light in a specific wavelength band focusing on the surface of the substrate 510 to have a relatively high intensity. Accordingly, the height of the surface of the substrate 510 may be detected by detecting the light in the specific wavelength band measured to have a relatively high intensity by the detector 235.

The laser supply head 210 is arranged above the mounting table 110, and may irradiate the substrate 510 mounted above the mounting table 110 with the laser beam LB. The laser supply head 210 may include at least one laser source 211, a beam delivery optical system 213, a focusing lens optical system 215, and an actuator 217.

The at least one laser source 211 may generate and output the laser beam LB. The at least one laser source 211 may include a light source or a plurality of light sources. The at least one laser source 211 may be configured to generate a laser beam LB, which has suitable features for processing the substrate 510 that is a workpiece. For example, a wavelength, a pulse width, an output power, and the like of the laser beam LB output from the at least one laser source 211 may be adjusted depending on a material and thickness of the substrate 510. In example embodiments, the at least one laser source 211 may output the laser beam LB having an ultraviolet wavelength band.

The beam delivery optical system 213 may deliver the laser beam LB, which is output from the at least one laser source 211, to the focusing lens optical system 215. The beam delivery optical system 213 may include free space optics, but is not limited thereto. The beam delivery optical system 213 may include various optical elements such as a polarizer, a lens, a reflecting mirror, a prism, a splitter, and the like.

The focusing lens optical system 215 may focus the laser beam LB at a focus point FP that is a preset position in the substrate 510. The focusing lens optical system 215 may be configured by a single lens or a plurality of lenses. The actuator 217 may adjust a position of the focus point FP of the laser beam LB through the focusing lens optical system 215. For example, the actuator 217 may adjust a position of a focusing lens of the focusing lens system 215 to adjust the focus point FP of the laser beam LB to focus on a target position in the substrate 510. For example, the actuator 217 may adjust the position of the focus point FP of the laser beam LB by adjusting a position in a light axis direction (or the vertical direction (the Z direction)) of the focus lens included in the focusing lens optical system 215.

The stage 300 may be connected to the chuck table 100. For example, the chuck table 100 may be disposed on the stage 300. The stage 300 may include an actuator for moving the mounting table 110 of the chuck table 100. In example embodiments, the stage 300 may be configured to linearly move the mounting table 110 in the horizontal direction (the X direction and/or the Y direction). In example embodiments, the stage 300 may be configured to linearly move the mounting table 110 in the vertical direction (the Z direction). In example embodiments, the stage 300 may rotate the mounting table 110. For example, the stage 300 may rotate the mounting table 110 with respect to a rotation axis parallel to the vertical direction (the Z direction).

In example embodiments, the stage 300 may tilt mounting table 110. For example, a tilting movement of the mounting table 110 by the stage 300 may include rotating the mounting table 110 with respect to a rotation axis parallel to the horizontal direction (the X direction and/or the Y direction). The stage 300 may adjust an incident angle of the laser beam LB with respect to the mounting surface 111 of the mounting table 110 or an incident angle of the laser beam LB with respect to the top surface of the substrate 510 by tilting the mounting table 110. For example, the stage 300 may tilt the mounting table 110 such that the incident angle of the laser beam LB with respect to the mounting surface 111 of the mounting table 110 is a target reference angle. For example, the stage 300 may have the mounting table 110 tilted such that the incident angle of the laser beam LB with respect to the top surface of the substrate 510 is a target reference angle.

The controller 400 may control general operations of the substrate processing apparatus 1000. The controller 400 may be implemented as hardware, firmware, software, or an arbitrary combination thereof. For example, the controller 400 may include a computing device such as a workstation computer, a desktop computer, a laptop computer, a tablet computer, and the like. For example, the controller 400 may include a memory device such as read only memory (ROM) and random access memory (RAM) storing various programming instructions, a microprocessor configured to process the programming instructions stored in the memory device and signals provided from the outside, and a processor such as a central processing unit (CPU) or a graphics processing unit (GPU). In addition, the controller 400 may include a receiver for receiving electrical signals and a transmitter for transmitting the electric signals.

The controller 400 may be configured to generate a height profile map including height information of the entire region of the top surface of the substrate 510, on the basis of height data of the substrate 510, detected by the height sensor 230. The height profile map may include information regarding measure positions (for example, a position in a first horizontal direction (the X direction) (or an X coordinate value), a position in a second horizontal direction (the Y direction) (or a Y coordinate value) of the substrate 510 and heights of the measure positions (for example, positions in the vertical direction (the Z directions) (or Z coordinate values) of the substrate 510, detected by the height sensor 230. For example, in the height profile map, the X coordinate value and the Y coordinate value indicate positions in the X direction and the Y direction (that is, an XY position) on a surface of the substrate 510, and the Z coordinate value indicates a position in the Z direction (that is, a Z position) in the XY position.

The controller 400 may perform auto focusing to automatically adjust the position of the focus point FP of the laser beam LB output from the laser supply head 210, on the basis of the height data of the substrate 510, detected by the height sensor 230. The controller 400 may generate a control signal for controlling the actuator 217 of the laser supply head 210, on the basis of the height data of the substrate 510, detected by the height sensor 230, and the actuator 217 of the laser supply head 210 may adjust the position of the focus point FP of the laser beam LB in response to the control signal transmitted from the controller 400.

Figure 7:
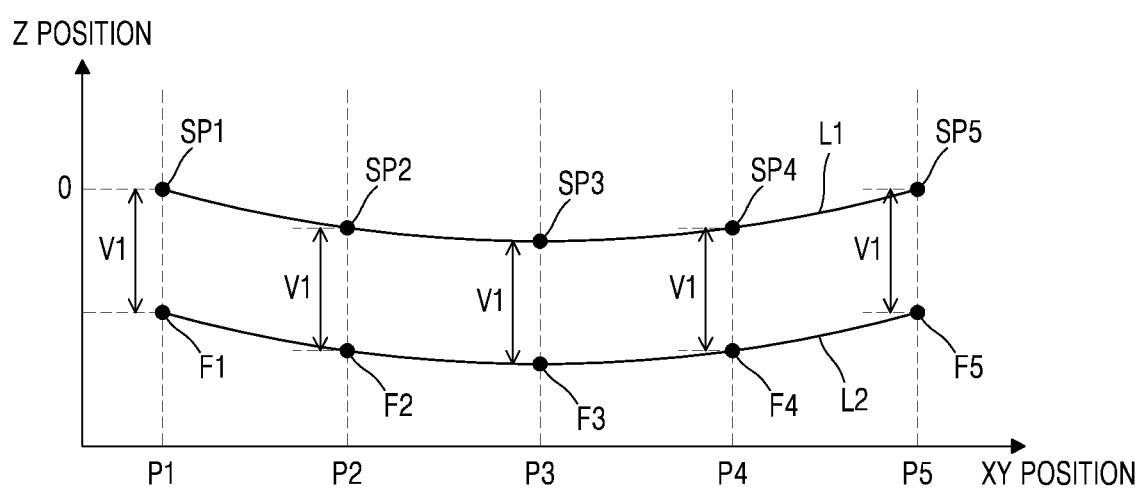
FIG. 7 is a graph of a height profile line and a light focus line.
Figure 8:
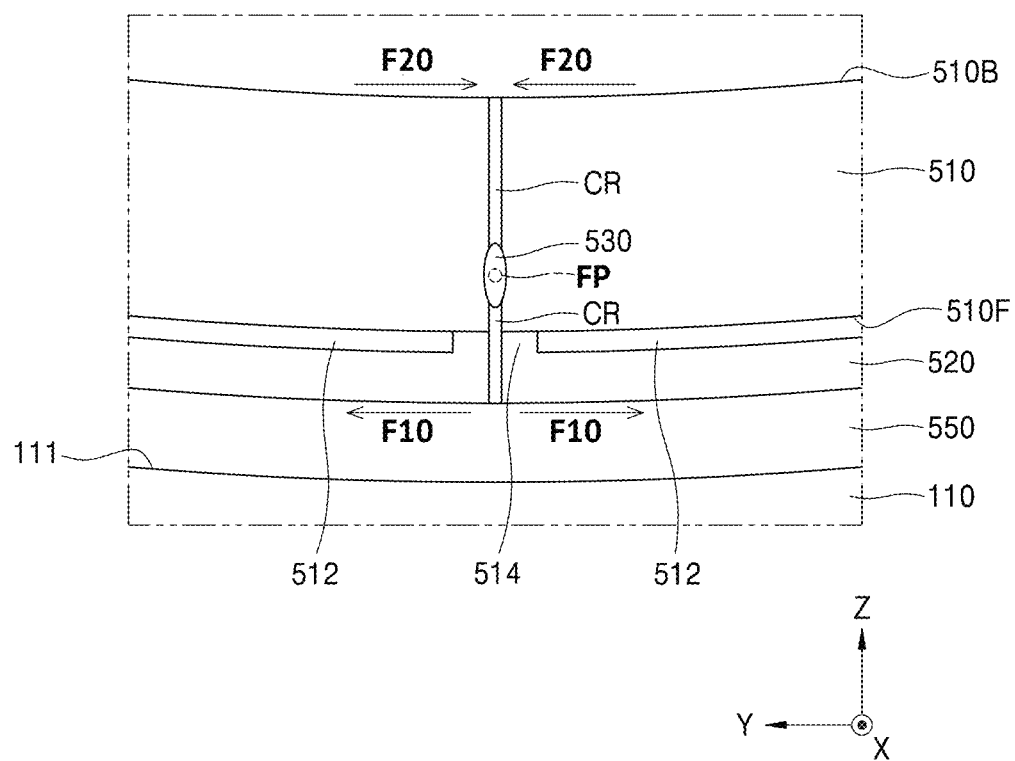
FIG. 8 is an enlarged cross-sectional view of portion VIII shown in FIG. 6E.

FIG. 5 is a flowchart of a method of processing a substrate, according to example embodiments of the inventive concept. FIGS. 6A to 6E are diagrams of a method of processing a substrate, according to example embodiments of the inventive concept. FIG. 7 is a graph of a height profile line L1 and a focus line L2. FIG. 8 is an enlarged cross-sectional view of portion VIII shown in FIG. 6E.

Hereinafter, a method of processing a substrate by using the substrate processing apparatus 1000 shown in FIG. 1 will be described with reference to FIGS. 5 to 8.

Figure 6A:
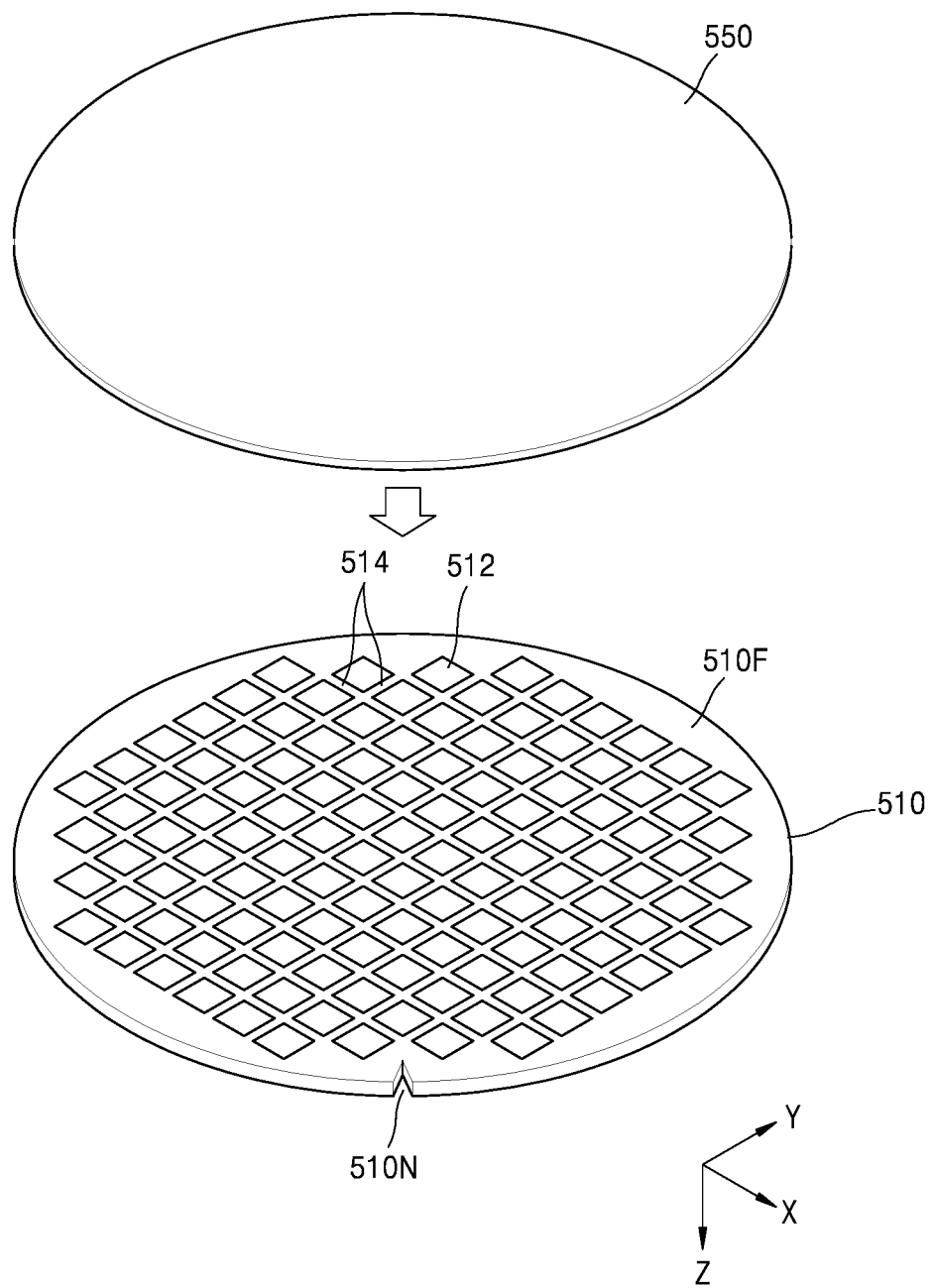

Referring to FIGS. 5 and 6A, in S110, the substrate 510 is prepared. The substrate 510 includes integrated circuit regions 512 and a cutting region 514 separating the integrated circuit regions 512.

The substrate 510 may include or may be a semiconductor substrate. The substrate 510 may include or may be a wafer, and may have a circle shape, e.g., in a plan view. The substrate 510 may include a notch 510N that is used as a reference mark for an alignment of the substrate 510. The substrate 510 may include or be formed of silicon. Alternatively, the substrate 510 may include or be formed of a semiconductor element such as germanium or a compound semiconductor such as silicon carbide (SiC), gallium arsenide (GaAs), indium arsenide (InAs), and indium phosphide (InP). Alternatively, the substrate 510 may have a silicon on insulator (SOI) structure. In some embodiments, the substrate 510 may include a conductive region, e.g., a well doped with an impurity or a structure doped with an impurity. In addition, the substrate 510 may have various device isolation structures such as a shallow trench isolation (STI) structure. Here, a case in which the substrate 510 is assumed as having a diameter of about twelve inches and a silicon wafer is used as the substrate will be described. However, it will be understood by those skilled in the art that the substrate 510 having a diameter smaller or greater than twelve inches may be used, and the substrate 510 including or formed of other materials than silicon may be used.

The substrate 510 may include an active surface 510F and an inactive surface 510B (see FIG. 6B) opposite each other. The substrate 510 may include the integrated circuit regions 512 and the cutting region 514 that separates the integrated circuit regions 512 from one another. The cutting regions 514 may be scribe lanes. The cutting region 514 may extend in the first horizontal direction (for example, the X direction) and/or the second horizontal direction (for example, the Y direction). The cutting region 514 may have a straight line shape having a uniform width. In a plan view, each of the integrated circuit regions 512 may be surrounded by the cutting region 514. As described later, by a cutting process performed on the cutting region 514, the substrate 510 and various kinds of material films formed on the substrate 510 are cut, and therefore, the integrated circuit regions 512 may be separated from one another into a plurality of semiconductor chips.

A semiconductor device layer 520 (see FIG. 8) may be formed on the active surface 510F of the substrate 510. The semiconductor device layer 520 may include an insulating layer and/or a conductive layer provided on the active surface 510F of the substrate 510. In addition, the semiconductor device layer 520 may include a semiconductor device and a metal interconnect structure.

The semiconductor device of the semiconductor device layer 520 may include a memory device and a logic device.

The memory device may be configured as, may include, and/or may be a volatile memory device or a nonvolatile memory device. The volatile memory device may include or may be, for example, an existing volatile memory device such as dynamic random access memory (DRAM), static RAM (SRAM), thyristor RAM (TRAM), zero capacitor RAM (ZRAM), or twin transistor RAM (TTRAM) and a volatile memory device currently in development. In addition, the nonvolatile memory device may include or may be, for example, an existing nonvolatile memory device such as flash memory, magnetic RAM (MRAM), spin-transfer torque MRAM (STT-MRAM), ferroelectric RAM (FRAM), phase change RAM (PRAM), resistive RAM (RRAM), nanotube RAM, polymer RAM, nano floating gate memory, holographic memory, molecular electronics memory, or an insulator resistance change memory and/or a nonvolatile memory device currently in development.

The logic device may be implemented as, for example, a microprocessor, a graphics processor, a signal processor, a network processor, an audio codec, a video codec, an application processor, a system-on-chip (SoC), or the like, but is not limited thereto. The microprocessor may include, for example, a single core or a multi-core.

In the inventive concept, the substrate 510 may indicate the substrate 510 itself or a stack structure including the substrate 510 and a material layer formed on the surface of the substrate 510. For example, the substrate 510 may be the substrate 510 itself, or may include the substrate 510 and the semiconductor device layer 520 formed on the active surface 510F of the substrate 510. In addition, "the surface of the substrate 510" may indicate an exposed surface of the substrate 510 itself or an exposed surface of the material layer formed on the substrate 510.

A protective sheet/film 550 may be attached on the active surface 510F of the substrate 510. The protective sheet/film 550 may cover the semiconductor device layer 520, and may protect the integrated circuit regions 512 during a dicing process performed on the substrate 510. The protective sheet/film 550 may include or be formed of, for example, a polyvinylchloride (PVC)-based polymer sheet/film, and may be attached to the substrate 510 by using an acryl resin-based bonding agent. The acryl resin-based bonding agent may have a thickness of about 2 µm to about 10 µm, and the protective sheet/film 550 may have a thickness of about 60 µm to about 200 µm. The protective sheet/film 550 may have a round shape having a diameter that is substantially identical to the diameter of the substrate 510.

In S120, after the substrate 510 is prepared, the substrate 510 is cut along the cutting region 514 of the substrate 510, and then the substrate 510 is separated into a plurality of semiconductor chips. For example, the dicing process is performed on the substrate 510 in S120. Hereinafter, provided is an example of a method of cutting the substrate 510 through a stealth dicing process.

In S121, referring to FIG. 6B, the substrate 510 provided from the outside is transferred onto the mounting surface 111 of the mounting table 110. The substrate 510 may be disposed on the mounting table 110 such that the active surface 510F of the substrate 510 faces the mounting surface 111 of the mounting table 110. The protective sheet/film 550 may be between the substrate 510 and the mounting surface 111 of the mounting table 110. As the mounting surface 111 of the mounting table 110 has a concave shape, a space may be formed between the substrate 510 and the mounting surface 111 of the mounting table 110.

Figure 6C:
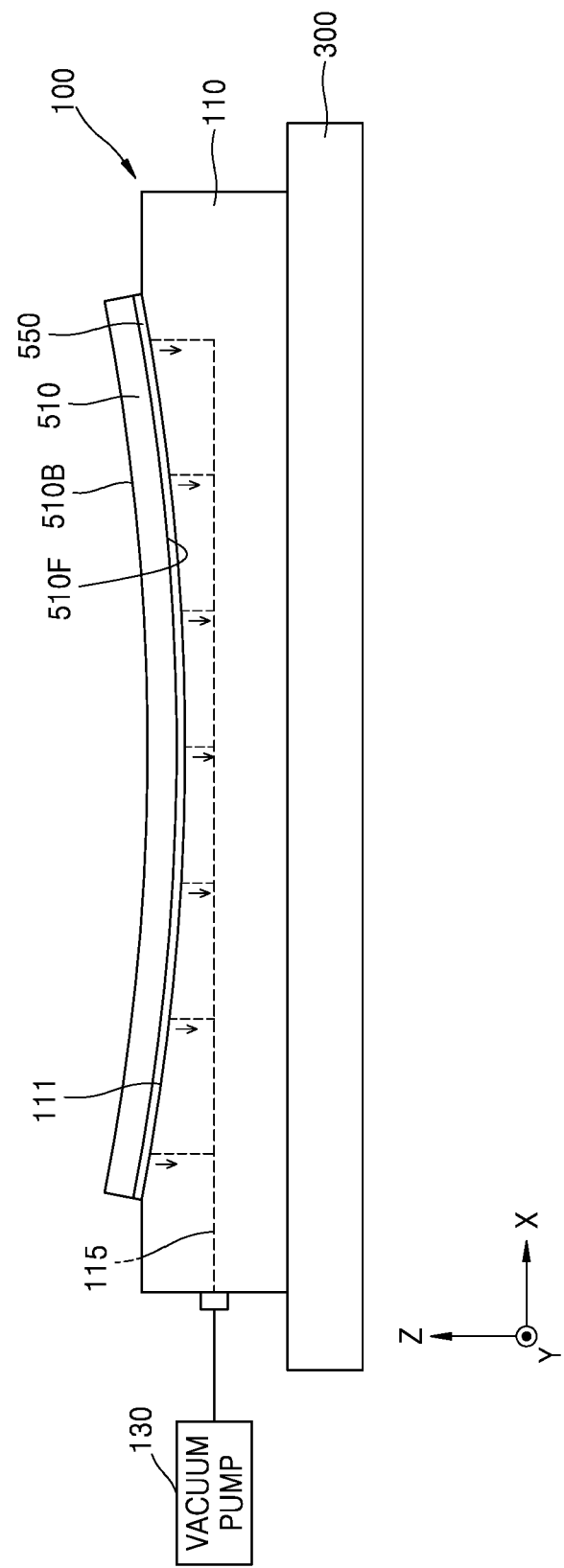

Referring to FIGS. 5 and 6C, in S122, the chuck table 100 may deform the substrate 510 by vacuum-adsorbing the substrate 510 to the mounting surface 111 of the mounting table 110.

The chuck table 100 may apply a vacuum pressure to the vacuum channels 115 and have the substrate 510 be vacuum-adsorbed to the mounting surface 111. The substrate 510 is attached to the mounting surface 111 due to the adsorption force applied through the vacuum channels 115, and may be forcibly deformed into a shape corresponding to the shape of the mounting surface 111. For example, the substrate 510 may be deformed into a concave shape in which the center protrudes downward with reference to the edge.

Referring to FIGS. 5 and 6D, in S123, the height of the surface of the deformed substrate 510 is detected by the height sensor 230.

The height sensor 230 may detect heights at a plurality of measure positions in the entire portion or a portion of the top surface of the substrate 510. For example, the height sensor 230 may be configured to detect the heights of a first measure position SP1, a second measure position SP2, a third measure position SP3, a fourth measure position SP4, and a fifth measure position SP5 of the top surface of the substrate 510 while the mounting table 110 moves in the horizontal direction (the X direction and/or the Y direction). The height sensor 230 may transmit the detected height data of the top surface of the substrate 510 to the controller 400.

FIG. 6D shows an example in which the height of the substrate 510 is detected at the first measure position SP1, the second measure position SP2, the third measure position SP3, the fourth measure position SP4, and the fifth measure position SP5 on a first scanning path of the top surface of the substrate 510 while moving the mounting table 110 in a first scanning direction SD1 parallel to the first horizontal direction (the X direction). The first scanning path is in the cutting region 514 (see FIG. 6A) of the substrate 510, and may linearly extend, e.g., in a plan view, from an edge of the top surface of the substrate 510 to another edge (e.g., an opposite edge) of the top surface of the substrate 510. For example, the height sensor 230 may initiate the height detection operation at the first measure position SP1 adjacent to the edge of the substrate 510, and may sequentially perform the height detection operation at the second measure position SP2, the third measure position SP3, the fourth measure position SP4, and the fifth measure position SP5 in order of adjacency to the first measure position SP1. Although FIG. 6D illustrates that the height sensor 230 detects the height of the substrate 510 at five measurement positions, this is merely an example, and the height sensor 230 may be configured to detect the height of the substrate 510 at tens to thousands of measure positions in the first scanning path.

Referring to FIGS. 6D and 7, the height data measured at the first measure position SP1, the second measure position SP2, the third measure position SP3, the fourth measure position SP4, and the fifth measure position SP5 may include a first XY position P1, a second XY position P2, a third XY position P3, a fourth XY position P4, and a fifth XY position P5 respectively corresponding to the first measure position SP1, the second measure position SP2, the third measure position SP3, the fourth measure position SP4, and the fifth measure position SP5 and Z positions detected at the first measure position SP1, the second measure position SP2, the third measure position SP3, the fourth measure position SP4, and the fifth measure position SP5. For example, the Z position detected at the first measure position SP1 that is a measurement start point/position SP1 may be determined to be zero that is a reference value, and the Z positions detected at the second measure position SP2, the third measurement point/position SP3, the fourth measure position SP4, and the fifth measure position SP5 may be determined by differences from the reference value. The controller 400 may generate a height profile line L1 corresponding to a profile of the top surface of the substrate 510, on the basis of the height data detected by the height sensor 230. For example, the height profile line L1 may indicate and/or be the same as a profile of the top surface of the substrate 510 in the first scanning path.

Figure 6E:
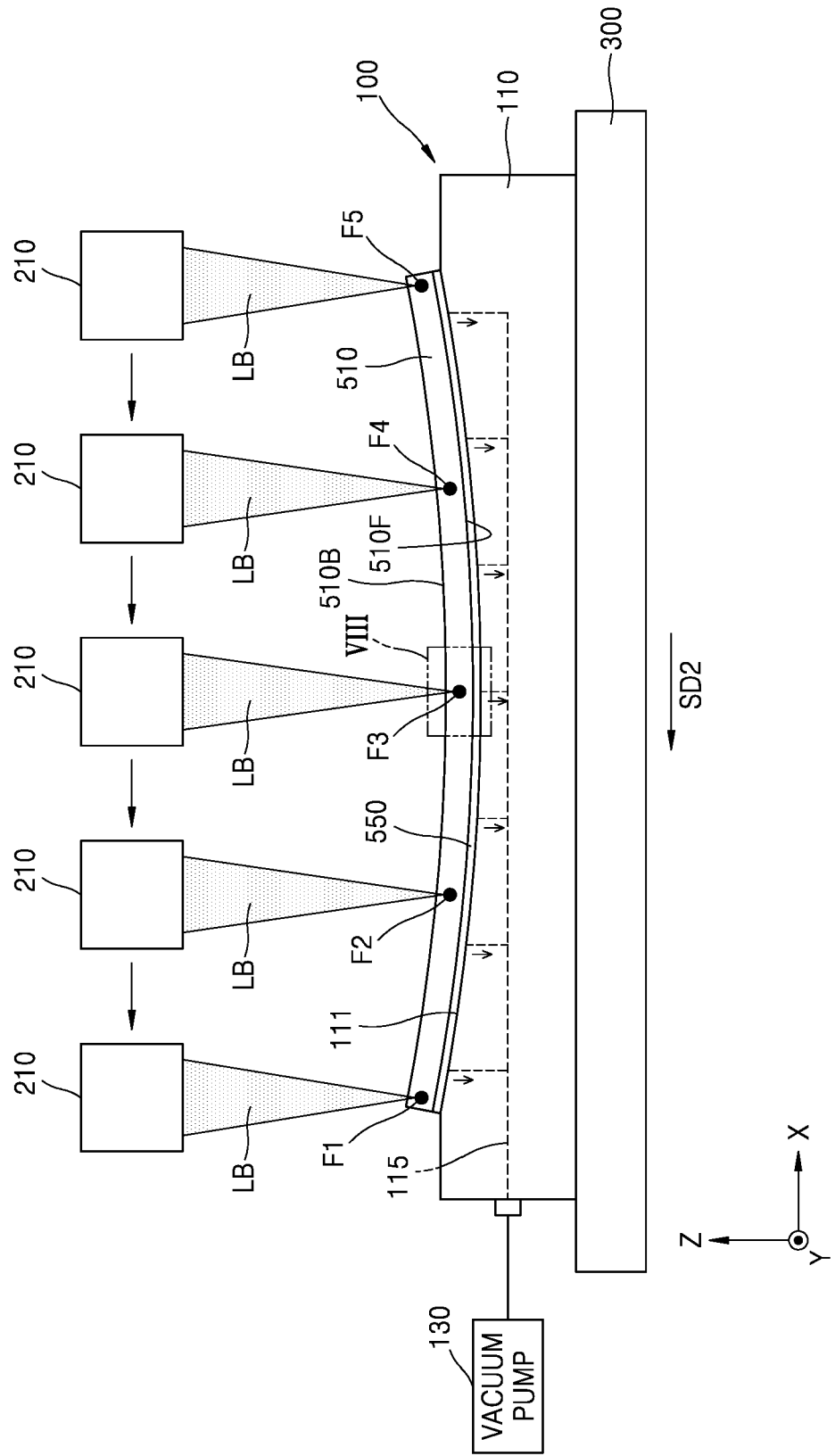

Referring to FIGS. 5, 6E and 7, in S124, the height of the surface of the substrate 510 is detected by the height sensor 230, and then, positions of a plurality of focus points including a first focus point F1, a second focus point F20, a third focus point F3, a fourth focus point F4, and a fifth focus point F5 of the laser beam LB are determined.

The first focus point F1, the second focus point F2, the third focus point F3, the fourth focus point F4, and the fifth focus point F5 of the laser beam LB are in the cutting region 514 (see FIG. 6A) of the substrate 510, and may overlap the first scanning path in the vertical direction. The first focus point F1, the second focus point F2, the third focus point F3, the fourth focus point F4, and the fifth focus point F5 may be determined to be spaced apart by a same distance in the vertical direction (the Z direction) from the top surface of the substrate 510. In example embodiments, the controller 400 may form/create/determine a focus line L2 including the first focus point F1, the second focus point F2, the third focus point F3, the fourth focus point F4, and the fifth focus point F5, on the basis of the height data and/or the height profile line L1. The focus line L2 is offset by a certain offset distance V1 in the vertical direction (the Z direction) from the height profile line L1, and may have a profile identical or similar to the profile of the top surface of the substrate 510.

Referring to FIGS. 5, 6E and 8, in S125, a modification layer 530 is formed in the substrate 510 by irradiating the first focus point F1, the second focus point F2, the third focus point F3, the fourth focus point F4, and the fifth focus point F5 of the deformed substrate 510 with the laser beam LB (e.g., by radiating the laser beam to the first focus point F1, the second focus point F2, the third focus point F3, the fourth focus point F4, and the fifth focus point F5).

While the substrate 510 is deformed by the chuck table 100, the laser supply head 210 may irradiate the first focus point F1, the second focus point F2, the third focus point F3, the fourth focus point F4, and the fifth focus point F5 with the laser beam LB or may irradiate the substrate along the focus line L2 with the laser beam LB. Although FIG. 6E illustrates that the laser supply head 210 irradiates five focus points with the laser beam LB, this is merely an example, and the laser supply head 210 may irradiate tens to thousands focus points along the focus line L2 of the substrate with the laser beam LB. Here, to reduce degradation of laser processing features or deviation of laser processing features depending on response performance of the actuator 217, a distance in the vertical direction (the Z direction) between two adjacent focus points may be set within about 10 µm.

For example, a distance between each of the first focus point F1, the second focus point F2, the third focus point F3, the fourth focus point F4, and the fifth focus point F5 and the active surface 510F of the substrate 510 may be from about 20 µm to about 120 µm, from about 40 µm to about 100 µm, or from about 60 µm to about 80 µm. The laser supply head 210 may focus the laser beam LB, which has a wavelength band capable of transmitting through the substrate 510, at each of the first focus point F1, the second focus point F2, the third focus point F3, the fourth focus point F4, and the fifth focus point F5 in the substrate 510. Each of the focus points F1, F2, F3, F4 and F5 may be repeatedly irradiated with the laser beam LB in a pulse width lasting for a very short time period (for example, equal to or less than 1 µs). As each of the first focus point F1, the second focus point F2, the third focus point F3, the fourth focus point F4, and the fifth focus point F5 in the substrate 510 is repeatedly irradiated with the laser beam LB, the modification layer 530 may be formed along the focus line L2 in the substrate 510. The modification layer 530 may include a high-density defect (for example, a dislocation) caused due to adsorption of the laser beam LB, and cracks CR may propagate from the modification layer 530.

FIG. 6E illustrates an example in which the modification layer 530 is formed by irradiating the first focus point F1, the second focus point F2, the third focus point F3, the fourth focus point F4, and the fifth focus point F5 with the laser beam LB while moving the mounting table 110 in a second scanning direction SD2 opposite to the first scanning direction SD1 (see FIG. 6D). For example, the laser beam LB may first irradiate the fifth focus point F5 adjacent to the other edge of the top surface of the substrate 510, and the laser beam LB may continuously or discontinuously irradiate the substrate 510 from the other edge of the top surface of the substrate 510 to the edge of the top surface of the substrate 510.

In example embodiments, the focus points FP of the laser beam LB may be more adjacent, e.g., closer, to the active surface 510F than to the inactive surface 510B of the substrate 510, e.g., in a vertical direction and/or in a perpendicular direction to the surfaces 510F and 510B, and the modification layer 530 may also be more adjacent, e.g., closer, to the active surface 510F than to the inactive surface 510B of the substrate 510, e.g., in the vertical direction and/or in the perpendicular direction to the surfaces 510F and 510B. In this case, the cracks CR initiated from the modification layer 530 are propagated to the semiconductor device layer 520, and the semiconductor device layer 520 may be cut by the cracks CR. The integrated circuit regions 512 are separated from one another by the cracks CR, and the integrated circuit regions 512 that are separated from one another may each form a semiconductor chip.

As shown in FIG. 8, while the substrate 510 is forcibly deformed into a concave shape, tensile strength F10 may be applied to a bottom side/surface of the substrate 510 adjacent to the mounting surface 111 of the mounting table 110, and compressive stress F20 may be applied to a top side/surface of the substrate 510. Tensile stress F10 may be predominantly applied to a region near the modification layer 530 that is formed as the laser beam LB irradiates the focus point FP adjacent to the active surface 510F of the substrate 510. The tensile stress F10 facilitates the forming of the modification layer 530, and may increase a propagation distance of the cracks CR starting from the modification layer 530.

Figure 9A:
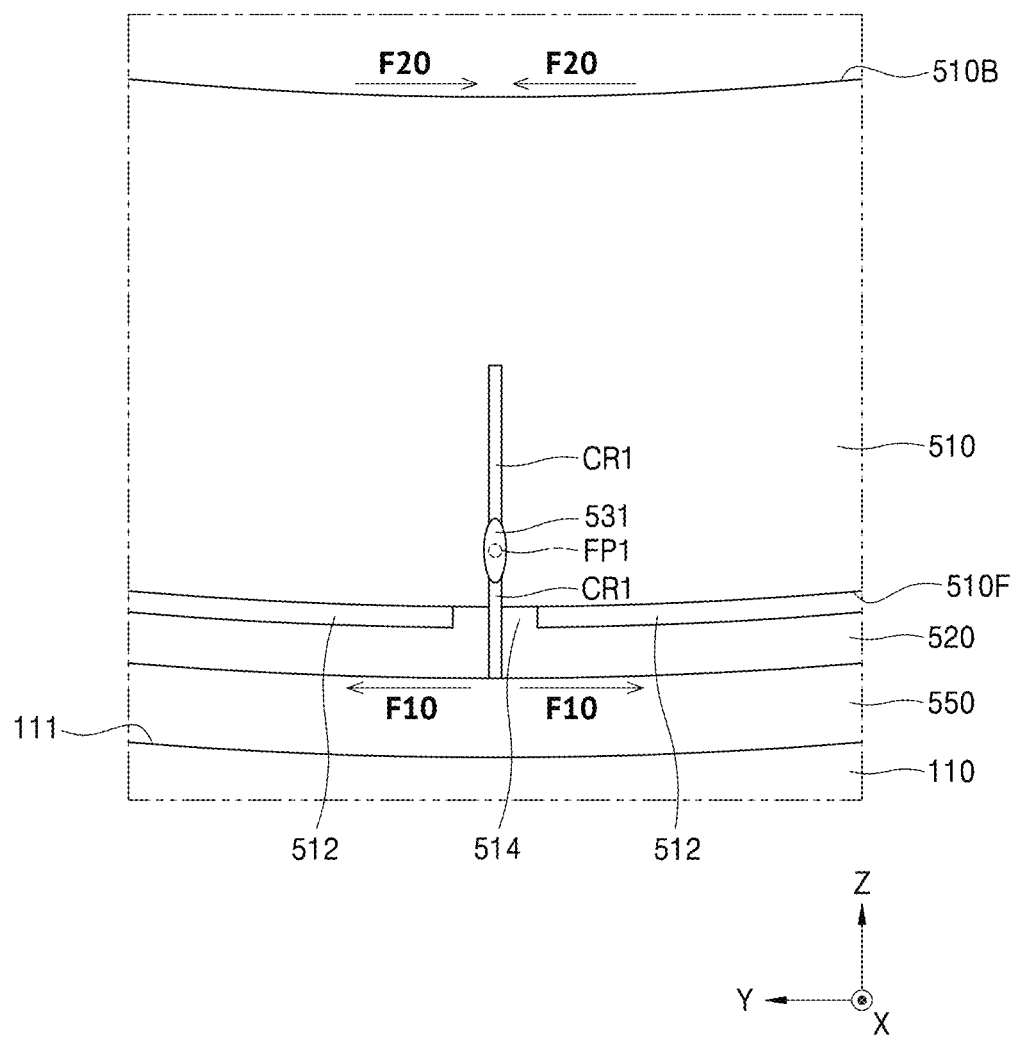
FIGS. 9A and 9B are diagrams of a method of processing a substrate, according to example embodiments of the inventive concept.
Figure 9B:
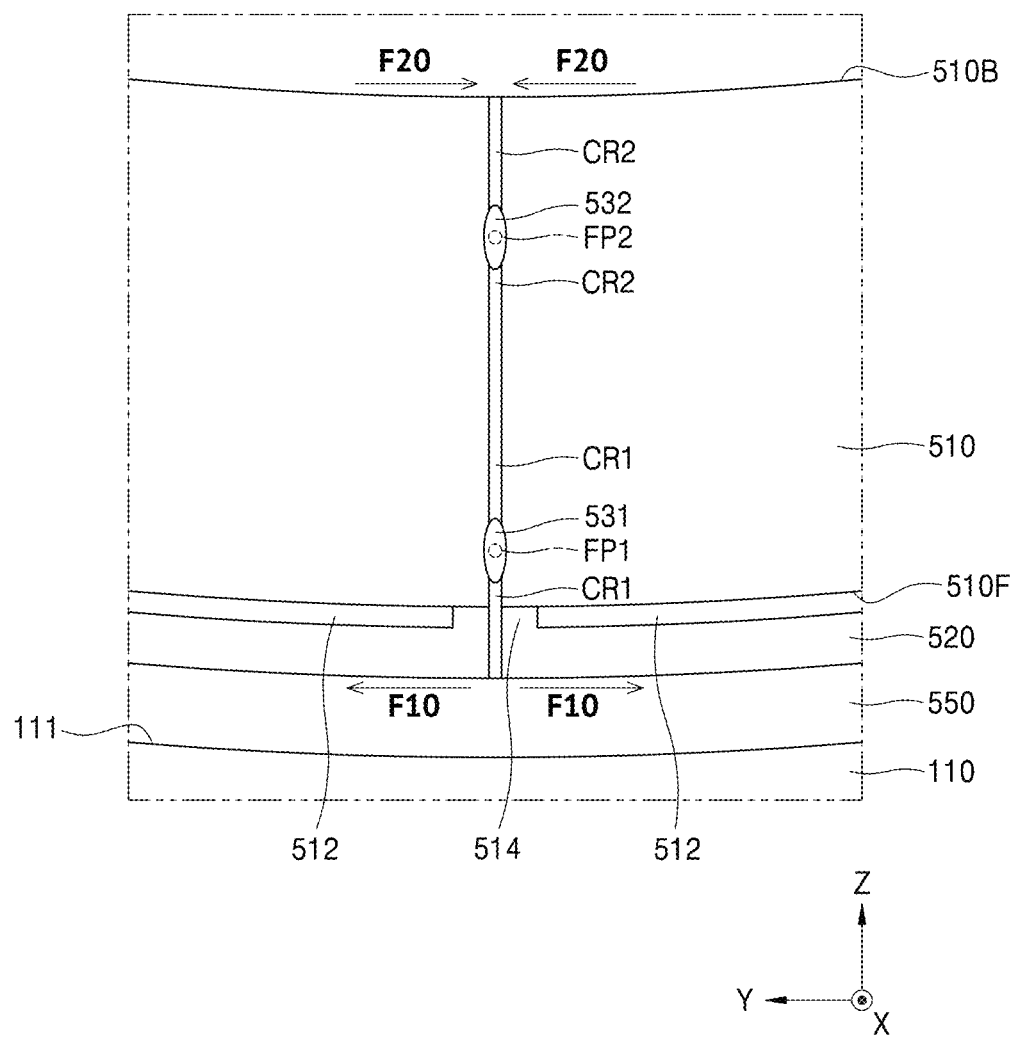

FIGS. 9A and 9B are diagrams of a method of processing a substrate, according to example embodiments of the inventive concept.

Hereinafter, a method of performing a stealth dicing process on the substrate 510 will be described as an example of a method of processing the substrate 510 by using the substrate processing apparatus 1000 shown in FIG. 1, with reference to FIGS. 1, 9A, and 9B.

Referring to FIG. 9A, the laser supply head 210 may perform first laser scanning to scan the first focus point FP1 in the substrate 510 with the laser beam LB to form a first modification layer 531 in the substrate 510. The first focus point FP1 may be determined on the basis of the height data of the top surface of the substrate 510 detected by the height sensor 230. For example, the first focus point FP1 may be on a first focus line offset by a first offset distance in the vertical direction (the Z direction) from the height profile line L1 (see FIG. 7) of the top surface of the substrate 510 detected by the height sensor 230. During the performance of the first laser scanning, the stage 300 may move the mounting table 110 in a direction (for example, the X direction) perpendicular to a direction (for example, the Z direction) in which the laser beam LB is scanned (e.g., emits/propagates) such that an irradiation position of the laser beam LB moves along the cut region 514 (see FIG. 6A) of the substrate 510.

During the first laser scanning, the laser supply head 210 may focus the laser beam LB at the first focus point FP1 in the substrate 510. The first focus point FP1 may be more adjacent, e.g., closer, to the active surface 510F than the inactive surface 510B of the substrate 510. As the laser beam LB irradiates the first focus point FP1, the first modification layer 531 may be formed at the first focus point F1 and the periphery thereof.

Although FIG. 9A illustrates that the laser beam LB irradiates one first focus point FP1, the laser beam LB may continuously or discontinuously irradiate the substrate 510 along the first focus line including a plurality of the first focus points FP1, and the first modification layer 531 may be formed along the first focus line including the plurality of first focus points FP1. During the first laser scanning, a scanning position of the laser beam LB moves in the horizontal direction (for example, the X direction), and accordingly, the first modification layer 531 may also continuously or discontinuously extend in the horizontal direction (for example, the X direction). A first crack CR1 starting from the first modification layer 531 may propagate in a thickness direction (e.g., the Z direction) of the substrate 510. For example, the first crack CR1 may propagate both downwards and upwards from the first modification layer 531. The semiconductor device layer 520 may be cut by the first crack CR1 propagated downwards from the first modification layer 531.

Referring to FIG. 9B, the laser supply head 210 may perform second laser scanning to scan the second focus point FP2 in the substrate 510 with the laser beam LB to form a second modification layer 532 in the substrate 510. The second focus point FP2 may be determined on the basis of the height data of the top surface of the substrate 510 detected by the height sensor 230. For example, the second focus point FP2 may be on a second focus line offset by a uniform second offset distance in the vertical direction (the Z direction) from the height profile line L1 (see FIG. 7) of the top surface of the substrate 510 detected by the height sensor 230. The second focus line may be more adjacent, e.g., closer, to the height profile line L1 than to the first focus line. During the performance of the second laser scanning, the stage 300 may move the mounting table 110 in a direction (for example, the X direction) perpendicular to a direction (for example, the Z direction) in which the laser beam LB is scanned (e.g., emits/propagates) such that the irradiation position of the laser beam LB moves along the cut region 514 (see FIG. 6A) of the substrate 510.

During the second laser scanning, the laser supply head 210 may focus the laser beam LB at the second focus point FP2 in the substrate 510. The second focus point FP2 may be a point apart from the first focus point FP1 in a direction receding from the mounting surface 111 of the mounting table 110. For example, a distance in the vertical direction (the Z direction) between the second focus point FP2 and the first focus point FP1 may be from about 100 μm to about 200 μm. When the first point FP1 is a first distance from the mounting surface 111 of the mounting table 110, the second distance FP2 may be a second distance that is greater than the first distance from the mounting surface 111 of the mounting table 110. For example, the first focus point FP1 may be more adjacent, e.g., closer, to the mounting surface 111 of the mounting table 110 than the second focus point FP1.

As the laser beam LB irradiates the second focus point FP2, the second modification layer 532 may be formed at the second focus point FP2 and a periphery thereof. Although FIG. 9B illustrates that the laser beam LB irradiates one second focus point FP2, the laser beam LB may continuously or discontinuously irradiate the substrate 510 along the second focus line including a plurality of the second focus points FP2, and the second modification layer 532 may be formed along the second focus line including the plurality of second focus points FP2. As the scanning position of the laser beam LB moves in the horizontal direction (for example, the X direction), the second modification layer 532 may also continuously or discontinuously extend in the horizontal direction (for example, the X direction). A second crack CR2 starting from the second modification layer 532 may propagate in the thickness direction (for example, the Z direction) of the substrate 510. For example, the second crack CR2 may propagate both downwards and upwards from the second modification layer 532. In this case, the second crack CR2 propagated downward from the second modification layer 532 may be connected (e.g., directly connected) to the first crack CR1 propagated from the first modification layer 531, and the second crack CR2 extending upward from the second modification layer 532 may extend to the inactive surface 510B of the substrate 510. In this case, the cutting of the substrate 510 may be completed by the first crack CR1 propagated from the first modification layer 531 and the second crack CR2 propagated from the second modification layer 532.

Although FIGS. 9A and 9B illustrate that the cutting of the substrate 510 is finished through two laser scanning processes, the cutting of the substrate 510 may be finished through three or more times of laser scanning depending on a thickness of the substrate 510. When the substrate 510 is cut through several times of laser scanning, a focus point of the laser beam LB in subsequent laser scanning may be farther from the mounting surface 111 of the mounting table 110 than the first and second focus points of the laser beam LB in preceding laser scanning. The cutting of the substrate 510 may also be finished through only one laser scanning depending on the thickness of the substrate 510.

According to example embodiments of the inventive concept, by irradiating the substrate 510 with the laser beam LB for forming the cracks to the substrate 510 in a state where the substrate 510 is forcibly deformed into a concave shape, the modification layer 530 may be more easily formed, and a propagation distance of the cracks from the modification layer 530 may be increased. Accordingly, the number of times of laser scanning for finishing cutting of the substrate 510 may be reduced, and thus, the cost may be reduced and the productivity may be improved. Furthermore, according to example embodiments of the inventive concept, the substrate 510 may be cut by using the laser beam LB having a relatively low power, and therefore, damage to the semiconductor devices in the integrated circuit region 512 by scattering of the laser beam LB that frequently occurs when using the laser beam LB with a high power may be prevented. In addition, according to example embodiments of the inventive concept, the positions of the focus points of the laser beam for forming the modification layer may be automatically adjusted by using the height data of the surface of the substrate 510 detected by the height sensor 230, and therefore, the laser beam LB may irradiate areas of the same heights in the substrate 510 deformed into a concave shape. For example, the laser beam LB may irradiate consistent places (e.g., the same distances from the top surface) of the substrate 510.

Figure 10A:
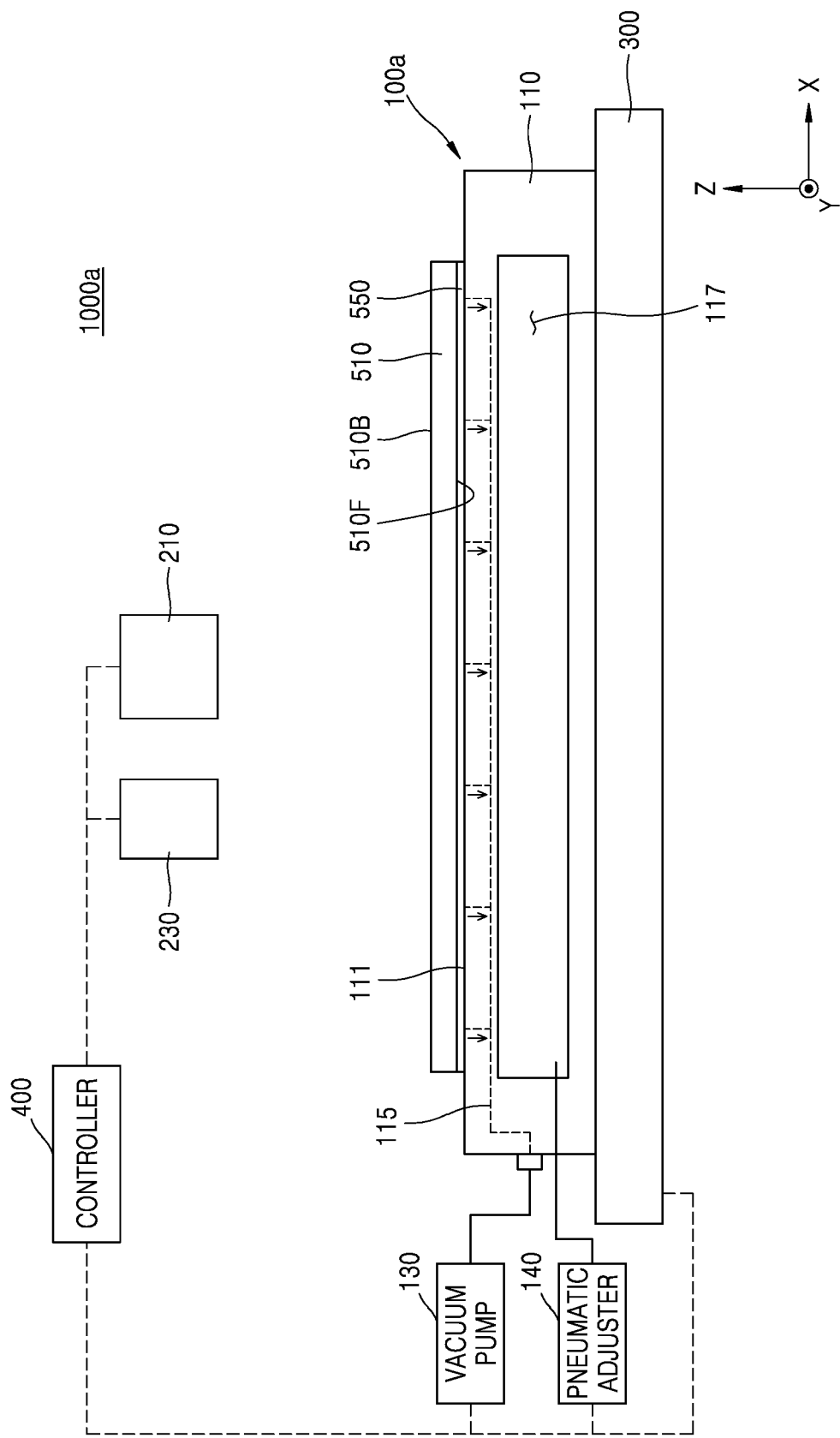
FIGS. 10A and 10B are diagrams of a substrate processing apparatus, according to example embodiments of the inventive concept.
Figure 10B:
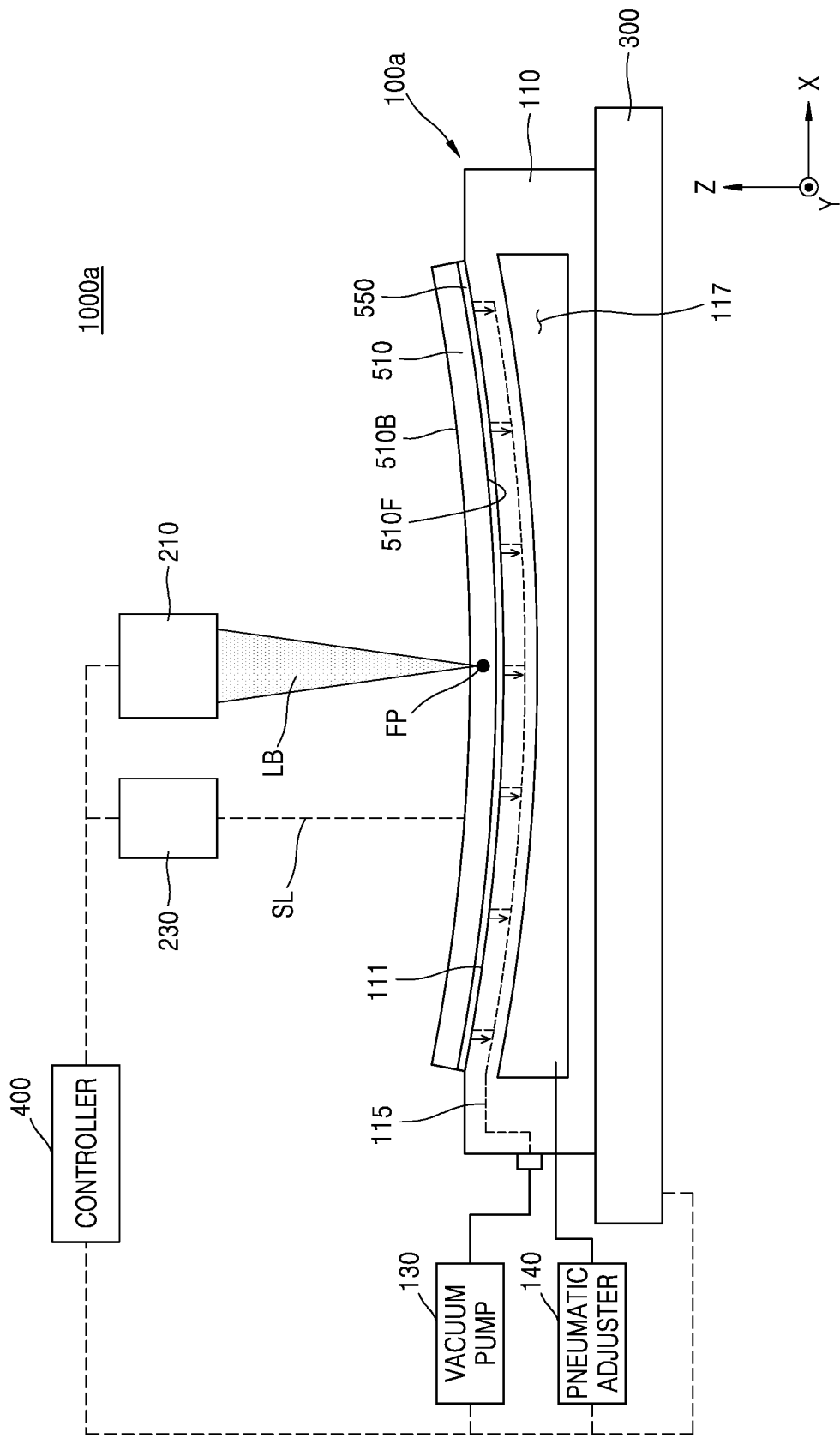

FIGS. 10A and 10B are diagrams of a substrate processing apparatus 1000a according to example embodiments of the inventive concept. Hereinafter, the substrate processing apparatus 1000a of FIGS. 10A and 10B will be described mainly about differences from the substrate processing apparatus 1000 described with reference to FIG. 1.

Referring to FIGS. 10A and 10B, a chuck table 100a may adjust the shape and/or the curvature of the mounting surface 111 of the mounting table 110. For example, the mounting surface 111 of the mounting table 110 may be configured to be switchable between a first state that is flat, as shown in FIG. 10A, and a second state having a concave curved surface as shown in FIG. 10B.

In example embodiments, the mounting table 110 may include a cavity 117 therein. The cavity 117 may be provided below the mounting surface 111 and may overlap with the mounting surface 111 in the vertical direction. The chuck table 100a may include a pneumatic adjuster 140 connected to the cavity 117. The pneumatic adjuster 140 may adjust a pressure of the cavity 117 by injecting air into the cavity 117 of the mounting table 110 or discharging the air from the cavity 117 of the mounting table 110. Depending on the pressure of the cavity 117 of the mounting table 110, the shape of the mounting surface 111 may be changed/adjusted. For example, to change the mounting surface 111 of the mounting table 110 from the first state of being flat to the second state of being concave, the pneumatic adjuster 140 may reduce the pressure of the cavity 117 by discharging air from the cavity 117. As the pressure of the cavity 117 is reduced, the mounting surface 111 of the mounting table 110 may be deformed in a concave shape. In addition, to change the mounting surface 111 of the mounting table 110 from the second state of being concave to the first state of being flat, the pneumatic adjuster 140 may increase the pressure of the cavity 117 by injecting air into the cavity 117. The mounting table 110 may include or be formed of a material, a shape of which may be changed due to an external force. For example, the mounting table 110 may include a metal, silicon, rubber, ceramic, or a combination thereof.

In example embodiments, the pneumatic adjuster 140 may include an air pump for injecting air into the cavity 117, a discharge pump for discharging the air in the cavity 117, a flow control valve mounted on an air flow path connected to the cavity 117, and the like.

In example embodiments, the height sensor 230 may measure the height of the mounting surface 111 of the mounting table 110, and the controller 400 may detect a degree of deformation of the mounting surface 111 of the mounting table 110 on the basis of the height data of the mounting surface 111 of the mounting table 110 detected by the height sensor 230. When the degree of deformation of the mounting surface 111 of the mounting table 110 is different from the reference value, the pressure of the cavity 117 may be adjusted until the degree of deformation of the mounting surface 111 of the mounting table 110 reaches the reference value.

In example embodiments, the height sensor 230 measures the height of the top surface of the substrate 510, and the controller 400 may detect the degree of deformation of the mounting surface 111 of the mounting table 110 on the basis of the height data of the substrate 510 detected by the height sensor 230. When the degree of deformation of the substrate 510 is different from the reference value, the pressure of the cavity 117 may be adjusted until the degree of deformation of the substrate 510 reaches the reference value.

In example embodiments, the chuck table 100a may vacuum-adsorb the substrate 510 while the mounting surface 111 of the mounting table 110 is being maintained in a flat state as shown in FIG. 10A. After the substrate 510 is vacuum-adsorbed to the mounting surface 111 of the mounting table 110, the chuck table 110a may modify the mounting surface 111 of the mounting table 110 in a concave shape. As the mounting surface 111 of the mounting table 110 is modified from a flat shape to a concave shape, the substrate 510 fixed to the mounting surface 111 of the mounting table 110 may also be deformed into a concave shape. In this case, the deformation of substrate 510 may be more stably performed by deforming the shape of the substrate 510 after vacuum-adsorption on the substrate 510 is finished, e.g., than by deforming the shape of the substrate 510 by vacuum-adsorption, e.g., as described in the previous embodiments.

Above described example embodiments of methods of processing a substrate may be methods of manufacturing semiconductor devices. For example, each method of processing the substrate may be a part of a method of manufacturing semiconductor devices. As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. Semiconductor packages may include a package substrate, one or more semiconductor chips, and an encapsulant formed on the package substrate and covering the semiconductor chips.

While the inventive concept has been particularly shown and described with reference to embodiments thereof, it will be understood that various changes in form and details may be made therein without departing from the spirit and scope of the following claims.

What is claimed is:

1. A method of processing a substrate, the method comprising:

mounting a substrate on a concave mounting surface of a mounting table and deforming a surface of the substrate into a concave shape corresponding to the concave mounting surface;

detecting, by a height sensor, a height of the deformed surface of the substrate in a vertical direction while a location of the mounting table moves along a horizontal direction with respect to a location of the height sensor to generate a curved height profile line corresponding to a profile of the deformed surface of the substrate;

determining positions of a plurality of first focus points based on the curved height profile line of the surface of the substrate, detected by the height sensor; and forming a first modification layer in the substrate by irradiating the plurality of first focus points with a laser beam while the substrate remains mounted to the concave mounting surface of the mounting table.

2. The method of claim 1, wherein the detecting of the height of the deformed surface of the substrate comprises detecting heights at a plurality of measure positions on the deformed surface of the substrate while moving the mounting table in the horizontal direction.

3. The method of claim 1, wherein the plurality of first focus points are on a focus line offset by a uniform distance in the vertical direction from the curved height profile line.

4. The method of claim 1,
further comprising determining positions of a plurality of second focus points based on height data of the deformed surface of the substrate detected by the height sensor; and
forming a second modification layer in the substrate by irradiating the plurality of second focus points with a laser beam,
wherein the plurality of first focus points are closer to the concave mounting surface of the mounting table than the plurality of second focus points.

5. The method of claim 1,
wherein the concave mounting surface of the mounting table comprises a curved surface, and
in the deforming of the substrate, the substrate is vacuum-adsorbed to the concave mounting surface of the mounting table and deformed such that the deformed surface of the substrate has a curvature equal to a curvature of the concave mounting surface of the mounting table.

6. The method of claim 1,
wherein the mounting table comprises at least one first vacuum channel extending from a central portion of the mounting surface of the mounting table and at least one second vacuum channel extending from an outer portion of the mounting surface of the mounting table,
a central portion of the substrate is vacuum-adsorbed to the central portion of the mounting surface of the mounting table, and an outer portion of the substrate is vacuum-adsorbed to the outer portion of the mounting surface of the mounting table.

7. The method of claim 1, further comprising adjusting a curvature of the mounting surface of the mounting table.

8. The method of claim 7,
wherein the adjusting of the curvature of the mounting surface of the mounting table comprises
adjusting a pressure of a cavity of the mounting table by injecting air into the cavity of the mounting table or discharging air from the cavity of the mounting table.

9. The method of claim 1, wherein, from a cross-sectional view, the concave mounting surface of the mounting table extends in a curve shape from an edge to another edge of the mounting surface of the mounting table.

10. The method of claim 1, wherein the height sensor comprises a confocal sensor.

11. The method of claim 1,
wherein the substrate comprises a semiconductor substrate, and
the laser beam is in an infrared ray wavelength band.

12. A method of processing a substrate, the method comprising:
preparing a substrate, the substrate comprising a plurality of integrated circuit regions and a cutting region separating the integrated circuit regions from one another; and
cutting the substrate along the cutting region,
wherein the cutting of the substrate comprises:
mounting the substrate on a concave mounting surface of a mounting table, and adsorbing the substrate to the concave mounting surface to conform to the concave mounting surface, thereby deforming a surface of the substrate into a concave shape;
detecting, by a height sensor, a height of the deformed surface of the substrate in a vertical direction to generate a curved height profile line corresponding to a profile of the deformed surface of the substrate;
determining positions of a plurality of first focus points on the curved height profile line of the deformed surface of the substrate detected by the height sensor, wherein the plurality of first focus points are located in the substrate; and
forming a first modification layer in the substrate by irradiating the plurality of first focus points with a laser beam, wherein
the plurality of first focus points are provided in the cutting region and are each the same distance from the surface of the substrate.

13. The method of claim 12,
wherein the detecting the height of the deformed surface of the substrate comprises detecting heights at a plurality of measure positions on the surface of the substrate while moving the mounting table in a first horizontal direction, and
the forming of the first modification layer in the substrate comprises irradiating the plurality of first focus points with the laser beam while moving the mounting table in a direction opposite to the first horizontal direction.

14. The method of claim 12,
further comprising generating the curved height profile line corresponding to the profile of the surface of the substrate based on height data of the surface of the substrate detected by the height sensor, and
the plurality of first focus points are on a focus line offset by a uniform distance in the vertical direction from the height profile line.

15. The method of claim 14, further comprising:
determining positions of a plurality of second focus points based on the height data of the surface of the substrate detected by the height sensor; and
forming a second modification layer in the substrate by irradiating the plurality of second focus points with a laser beam,
wherein the plurality of second focus points are provided in the cutting region and on a second focus line offset by a uniform distance in the vertical direction from the height profile line.

16. The method of claim 12,
wherein the mounting surface of the mounting table comprises a concave curved surface,
the mounting table comprises at least one first vacuum channel extending from a central portion of the mounting surface of the mounting table and at least one second vacuum channel extending from an outer portion of the mounting surface of the mounting table,
a central portion of the substrate is vacuum-adsorbed to the central portion of the mounting surface of the mounting table, an outer portion of the substrate is vacuum-adsorbed to the outer portion of the mounting surface of the mounting table, and
in the deforming of the substrate, the substrate is vacuum-adsorbed to the mounting surface of the mounting table and deformed such that the surface of the substrate has a curvature equal to a curvature of the mounting surface.

17. The method of claim 16,
wherein the adsorbing the substrate to the concave mounting surface is controlled by a first pressure, and wherein the shape of the concave mounting surface is controlled by a second pressure different and separately controlled from the first pressure,
wherein the mounting table comprises a cavity provided below the mounting surface of the mounting table, and
the curvature of the mounting surface of the mounting table changes depending on a pressure of the cavity, which is the second pressure, and
wherein the first pressure is controlled by a vacuum pump and the second pressure is controlled by a pneumatic adjuster.

18. The method of claim 12, wherein a distance in the vertical direction between an edge of the mounting surface of the mounting table and a center of the mounting surface of the mounting table is from about 25 μm to about 800 μm.

19. A method of processing a substrate, the method comprising:
preparing a substrate, the substrate comprising a plurality of integrated circuit regions and a cutting region separating the integrated circuit regions from one another; and
cutting the substrate along the cutting region,
wherein the cutting of the substrate comprises:
transferring the substrate onto a mounting surface of a mounting table, the mounting surface comprising a concave surface;
deforming a surface of the substrate into a concave shape by vacuum-adsorbing the substrate to the mounting surface of the mounting table;
detecting, by using a height sensor, heights at a plurality of measurement points on the surface of the substrate at the same time that the mounting table moves in a first horizontal direction in relation to the height sensor,
determining positions of a plurality of first focus points based on height data of the surface of the substrate detected by the height sensor; and
forming a first modification layer in the substrate by irradiating the plurality of first focus points with a laser beam at the same time that the mounting table moves in a second horizontal direction opposite the first horizontal direction in relation to the height sensor,
wherein the plurality of first focus points are on a first focus line that is offset by a uniform distance from the surface of the substrate, the laser beam is an infrared ray, and a distance in a vertical direction between an edge of the mounting surface of the mounting table and a center of the mounting surface is from about 25 μm to about 800 μm.

\* \* \* \* \*